US008598468B2

(12) United States Patent
Kim et al.

(10) Patent No.: US 8,598,468 B2

(45) Date of Patent: Dec. 3, 2013

(54) ELECTROMAGNETIC BANDGAP STRUCTURE AND PRINTED CIRCUIT BOARD

(75) Inventors: Han Kim, Yongin-si (KR); Mi-Ja Han, Jeonju-si (KR); Hyo-Jic Jung, Daejeon (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 66 days.

(21) Appl. No.: 13/437,254

(22) Filed: Apr. 2, 2012

(65) Prior Publication Data

US 2012/0234591 A1 Sep. 20, 2012

Related U.S. Application Data

(62) Division of application No. 12/285,133, filed on Sep. 29, 2008, now Pat. No. 8,164,006.

(30) Foreign Application Priority Data

Mar. 19, 2008 (KR) ........................ 10-2008-0025604
Jun. 27, 2008 (KR) ........................ 10-2008-0062015

(51) Int. Cl.
*H01R 12/04* (2006.01)
*H05K 1/11* (2006.01)

(52) U.S. Cl.
USPC ........... 174/262; 174/255; 174/256; 174/261; 174/264

(58) Field of Classification Search
USPC ......... 174/255, 256, 261, 262, 264, 350, 360, 174/377
See application file for complete search history.

(56) References Cited

U.S. PATENT DOCUMENTS

| | | | | |
|---|---|---|---|---|
| 6,353,540 | B1 * | 3/2002 | Akiba et al. | 361/794 |
| 6,377,464 | B1 | 4/2002 | Hashemi et al. | |
| 6,476,771 | B1 | 11/2002 | McKinzie, III | |
| 7,369,018 | B2 * | 5/2008 | Shinabe | 333/204 |

FOREIGN PATENT DOCUMENTS

| | | |
|---|---|---|
| JP | 10-209726 | 8/1998 |
| JP | 2001-345661 | 12/2001 |

OTHER PUBLICATIONS

Japanese Office Action issued May 17, 2011 in corresponding Japanese Patent Application No. 2008-260017.
U.S. Patent Restriction Requirement mailed Jun. 2, 2011 in corresponding U.S. Appl. No. 12/285,133.
U.S. Patent Office Action mailed Aug. 2, 2011 in corresponding U.S. Appl. No. 12/285,133.

(Continued)

*Primary Examiner* — Jayprakash N Gandhi
*Assistant Examiner* — Dion Ferguson

(57) ABSTRACT

An electromagnetic bandgap structure including: at least three conductive plates; a first stitching via, configured to electrically connect any one of the conductive plates to another conductive plate; and a second stitching via, configured to electrically connect the one conductive plate to yet another conductive plate, wherein the first stitching via electrically connects the one conductive plate to another conductive plate by allowing a part of the first stitching via to be connected through a planar surface above or below the one conductive plate, and the second stitching via electrically connects the one conductive plate to yet another conductive plate by allowing a part of the second stitching via to be connected through a planar surface that is different from the planar surface through which the part of the first stitching via is connected, the two planar surfaces being placed in a same direction based on the conductive plates.

19 Claims, 26 Drawing Sheets

(56) References Cited

OTHER PUBLICATIONS

U.S. Patent Notice of Allowance, mailed Dec. 23, 2011 in corresponding U.S. Appl. No. 12/285,133.

U.S. Appl. No. 12/285,133, filed Sep. 29, 2008, Han Kim et al., Samsung Electro-Mechanics Co., Ltd.

Taiwan Office Action in corresponding Taiwan patent application No. 97,140,535 issued Aug. 14, 2012.

* cited by examiner

PRIOR ART

ELECTROMAGNETIC BANDGAP STRUCTURE AND PRINTED CIRCUIT BOARD

CROSS-REFERENCE TO RELATED APPLICATIONS

This application is a U.S. divisional application filed under 37 CFR 1.53(b) claiming priority benefit of U.S. Ser. No. 12/285,133 filed in the United States on Sep. 29, 2008, now U.S. Pat. No. 8,164,006 which claims earlier priority benefit to Korean Patent Application No. 10-2008-0062015 filed with the Korean Intellectual Property Office on Jun. 27, 2008 and Korean Patent Application No. 10-2008-0025604 filed with the Korean Intellectual Property Office on Mar. 19, 2008, the disclosures of which are incorporated herein by reference.

BACKGROUND

1. Field

The present invention relates to an electromagnetic bandgap structure, more specifically to an electromagnetic bandgap structure and a printed circuit board having the same that prevent a signal ranging a predetermined frequency band from being transmitted.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer and interference of an electromagnetic (EM) wave resulted from the operation frequency and its corresponding harmonics components of one electronic circuit to another electronic circuit. The transferred noise can be roughly classified into radiation noise and conduction noise.

The radiation noise (refer to the reference numeral 155 of FIG. 1) can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be obvious that the printed circuit board can be modified to have a 2, 6 or 8-layered structure.

As shown in FIG. 1, the printed circuit board 100 includes metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, both of the first electronic circuit 130 and the second electronic circuit 140 are assumed to be digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias (refer to the reference numeral 160 of FIG. 1).

If the first electronic circuit 130 and the second electronic circuit 140 have different operation frequencies, a conductive noise 150 caused by an operation frequency of the first electronic circuit 130 and its harmonics components is transferred to the second electronic circuit 140 as shown in FIG. 1. This has a disadvantageous effect on the accurate function/operation of the second electronic circuit 140.

With the growing complexity of electronic apparatuses and higher operation frequencies of digital circuits, it is increasingly more difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) has currently come into the spotlight to solve the foresaid conductive noise problem. This aims to block a signal of a predetermined frequency band by disposing an electromagnetic bandgap structure having a predetermined structural shape in a printed circuit board.

An electromagnetic bandgap structure having a mushroom type structure as shown in FIG. 2A and FIG. 2B has been studied.

The electromagnetic bandgap structure 200 shown in FIG. 2A and FIG. 2B is formed by repeatedly arranging a mushroom type structure 230, which includes a metal plate 232 formed between the first metal layer 211 and the second metal layer 212 and a via 234 connecting the first metal layer 211 to the metal plate 232, between a first metal layer 211 and a second metal layer 212, each of which functions as a ground layer and a power layer. A first dielectric layer is interposed between the first metal layer 211 and the metal plate 232, and a second dielectric layer is interposed between the metal plate 232 and the second metal layer 212.

As such, arranging the mushroom type structure 230 between the first metal layer 211 and the second metal layer 212 repeatedly can allow a signal x of a low frequency band (refer to FIG. 2C and FIG. 2D) and a signal y of a high frequency band (refer to FIG. 2C and FIG. 2D) to pass through the electromagnetic bandgap structure 200 and block a signal z of a certain frequency band (refer to FIG. 2C and FIG. 2D) ranging between the low frequency band and the high frequency band. In other words, the electromagnetic bandgap structure 200 shown in FIG. 2A and FIG. 2B can function as a band stop filter blocking a signal of a certain frequency band. This can be easily understood through an equivalent circuit of FIG. 2C.

In the equivalent circuit of the mushroom type electromagnetic bandgap structure 200 shown in FIG. 2C, a capacitance component C1 and an inductance component L1 are connected in series between the first metal layer 211 and the second metal layer 212. Here, C1 is a capacitance component formed by the second metal layer 212, the second dielectric layer 222 and the metal plate 232, and L1 is an inductance component formed by the via 234 placed between the metal plate 232 and the first dielectric layer 221. As a result, the mushroom type bandgap structure 200 can function as a kind of band stop filter by this L-C serial connection.

However, it is difficult to apply the mushroom type electromagnetic bandgap structure 200 in various apparatuses because the mushroom type electromagnetic bandgap structure 200 functions as a band stop filter by using one inductance component and one capacitance component only. This is because the acquirable length (i.e. corresponding to an inductance value) of the via 234 is limited in the structural shape of FIG. 2A and FIG. 2B. The acquirable capacitance value is also limited because the mushroom type structure 230 is placed between two adjacent metal layers only.

As new electronic apparatuses and communication apparatuses are increasingly becoming smaller, thinner and lighter, it is more difficult to select a desired bandgap frequency band by using the mushroom type electromagnetic bandgap structure 200 only. In other words, the mushroom type electromagnetic bandgap structure 200 shown in FIG. 2A and FIG. 2B has some restrictions in adjusting each bandgap frequency band to meet conditions and features of various application apparatuses or to lower a conductive noise to a desired noise level in a pertinent bandgap frequency band.

Accordingly, it is necessarily required to study the structure of the electromagnetic bandgap that not only can outstandingly block or reduce a conductive noise between a power layer and a ground layer but also can be universally applied to various application apparatuses having different bandgap frequency bands.

SUMMARY

The present invention provides an electromagnetic bandgap structure and a printed circuit board having the same that can block a conductive noise of a certain frequency band.

The present invention also provides an electromagnetic bandgap structure and a printed circuit board having the same that can solve a conductive noise by arranging an electromagnetic bandgap structure having a predetermined structural shape in a printed circuit board without using a bypass capacitor and a decoupling capacitor.

The present invention provides an electromagnetic bandgap structure and a printed circuit board having the same that can give more suitable design flexibility and freedom to a multilayer printed circuit board and realize at least two bandgap frequencies through stitching vias having different lengths.

The present invention provides an electromagnetic bandgap structure and a printed circuit board having the same that can be applied to various application apparatuses or electronic apparatuses by realizing various bandgap frequency bands.

In addition, the present invention provides an electromagnetic bandgap structure and a printed circuit board having the same that can block a conductive noise of a high frequency band when an operation frequency of a high frequency band is used as in a network board.

An aspect of the present invention features an electromagnetic bandgap structure including at least three conductive plates; a first stitching via, configured to electrically connect any one of the conductive plates to another conductive plate; and a second stitching via, configured to electrically connect the one conductive plate to yet another conductive plate, where the first stitching via electrically can connect the one conductive plate to another conductive plate by allowing a part of the first stitching via to be connected through a planar surface above the one conductive plate, and the second stitching via electrically can connect the one conductive plate to yet another conductive plate by allowing a part of the second stitching via to be connected through a planar surface below the one conductive plate.

Here, the first stitching via can include a first via, one end part of the first via configured to be connected to the one conductive plate; a second via, one end part of the second via configured to be connected to another conductive layer; and a connection pattern, configured to be placed on a planar surface above the one conductive plate and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

If there is an additional conduct layer between the conductive plate and the conductive layer, the first stitching via can pass through a clearance hole formed on the additional conductive layer such that the first stitching via is not electrically connected to the additional conductive layer.

The second stitching via can include a first via, one end part of the first via configured to be connected to the one conductive plate; a second via, one end part of the second via configured to be connected to yet another conductive layer; and a connection pattern, configured to be placed on a planar surface below the one conductive plate and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

If there is an additional conduct layer between the conductive plate and the conductive layer, the second stitching via can pass through a clearance hole formed on the additional conductive layer such that the second stitching via is not electrically connected to the additional conductive layer.

The length of the first stitching via can be different from that of the second stitching via.

The conductive layer can have a polygonal, circular or elliptical shape. The conductive plates can be placed on a same planar surface. Alternatively, the conductive plates can have a same size. The conductive plates can be distinguished into a plurality of groups having different sizes.

Another aspect of the present invention features an electromagnetic bandgap structure including at least three conductive plates; a first stitching via, configured to electrically connect any one of the conductive plates to another conductive plate; and a second stitching via, configured to electrically connect the one conductive plate to yet another conductive plate, where the first stitching via can electrically connect the one conductive plate to another conductive plate by allowing a part of the first stitching via to be connected through a planar surface above or below the one conductive plate, and the second stitching via can electrically connect the one conductive plate to yet another conductive plate by allowing a part of the second stitching via to be connected through a planar surface that is different from the planar surface through which the part of the first stitching via is connected, the two planar surfaces being placed in a same direction based on the three or more conductive plates Here, the first stitching via can include a first via, one end part of the first via configured to be connected to the one conductive plate;

a second via, one end part of the second via configured to be connected to another conductive layer; and a connection pattern, configured to be placed on a planar surface above or below the one conductive plate and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

The second stitching via can include second stitching via can include a first via, one end part of the first via configured to be connected to the one conductive plate; a second via, one end part of the second via configured to be connected to yet another conductive layer; and a connection pattern, configured to be placed on a planar surface that is different from the planar surface through which the part of the first stitching via is connected, the two planar surfaces being placed in a same direction based on the three or more conductive plates, and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

The conductive layer can have a polygonal, circular or elliptical shape. The conductive plates can have a same size. Alternatively, the conductive plates can be distinguished into a plurality of groups having different sizes. The conductive plates can be placed on a same planar surface.

Another aspect of the present invention features an electromagnetic bandgap structure including at least three conductive plates; a first stitching via, configured to electrically connect any one of the conductive plates to another conductive plate; and a second stitching via, configured to electrically connect the one conductive plate to yet another conductive plate, where the first stitching via and the second stitching via can electrically connect the one conductive plate to another conductive plate and yet another conductive plate, respectively, by allowing a part of the first stitching via and a part of the second stitching via to be connected through a location and another location, respectively, on a same planar surface, and at least one conductive layer can be placed between at least one of the part of the first stitching via and the part of the second stitching via and the conductive layers.

Here, the first stitching via can include a first via, one end part of the first via configured to be connected to the one conductive plate; a second via, one end part of the second via configured to be connected to another conductive layer; and a connection pattern, configured to be placed on the same planar surface and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

The second stitching via can include a first via, one end part of the first via configured to be connected to the one conductive plate; a second via, one end part of the second via configured to be connected to yet another conductive layer; and a connection pattern, configured to be placed on the same planar surface and to have one end part connected to the other end part of the first via and the other end part connected to the other end part of the second via.

If there is a conductive layer on a same planar surface corresponding to where the conductive pattern is to be formed, the connection pattern can be accommodated in a clearance hole formed on the conductive layer.

a clearance hole can be formed each on the conductive layer through which the first stitching via and the second stitching via, respectively, are to pass.

The conductive layer can have a polygonal, circular or elliptical shape. The conductive plates can have a same size. Alternatively, the conductive plates can be distinguished into a plurality of groups having different sizes. The conductive plates can be placed on a same planar surface.

BRIEF DESCRIPTION OF THE DRAWINGS

These and other features, aspects and advantages of the present invention will become better understood with regard to the following description, appended claims and accompanying drawings where:

DESCRIPTION OF EMBODIMENTS

Figure 1:
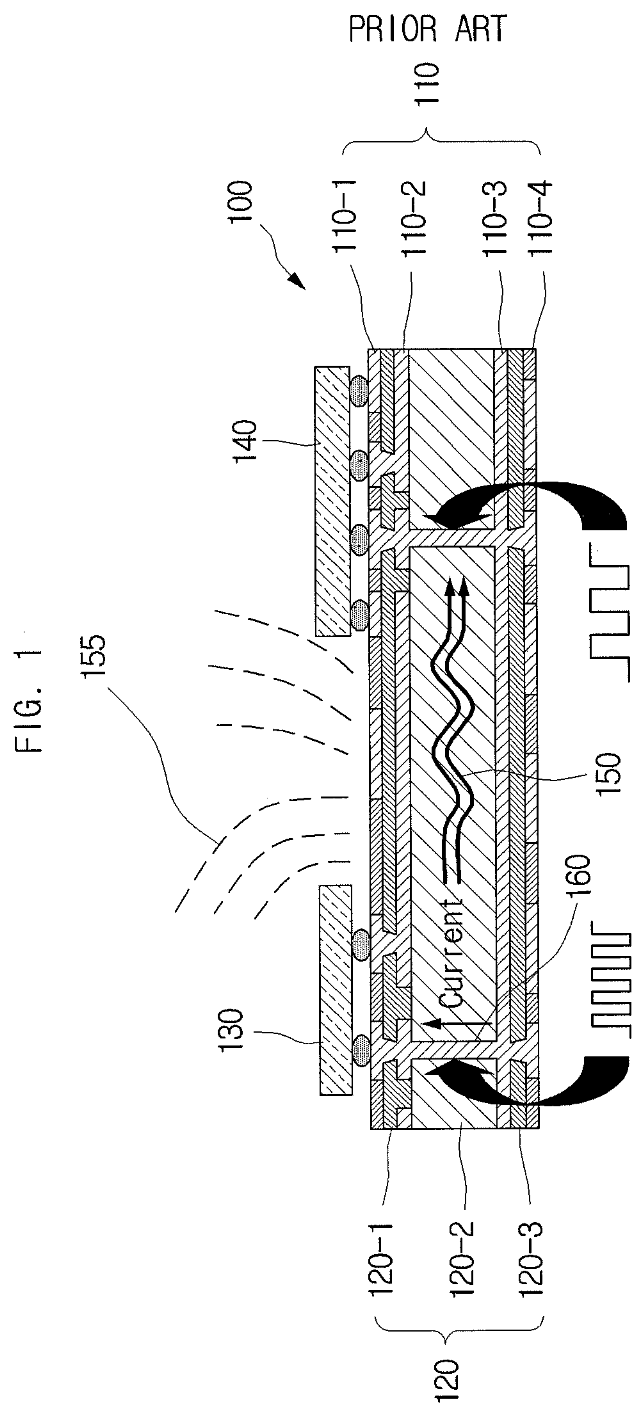
FIG. 1 is a sectional view showing a printed circuit board including two electronic circuits having different operation frequencies.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, an electromagnetic bandgap structure having a stitching via will be described as the basic principle of the present invention with reference to FIG. 3A through FIG. 3C for easy understanding of the present invention before each embodiment of the present invention shown in FIG. 5 through FIG. 8 is described in detail.

As seen through the comparison with FIG. 3A through FIG. 3C described below, it is suggested that the electromagnetic bandgap structure of FIG. 5 through FIG. 8 in accordance with each embodiment of the present invention is an electromagnetic bandgap structure having a stitching via that is applicable to a multi-layered (i.e. 3- or more-layered) printed circuit board.

Figure 3A:
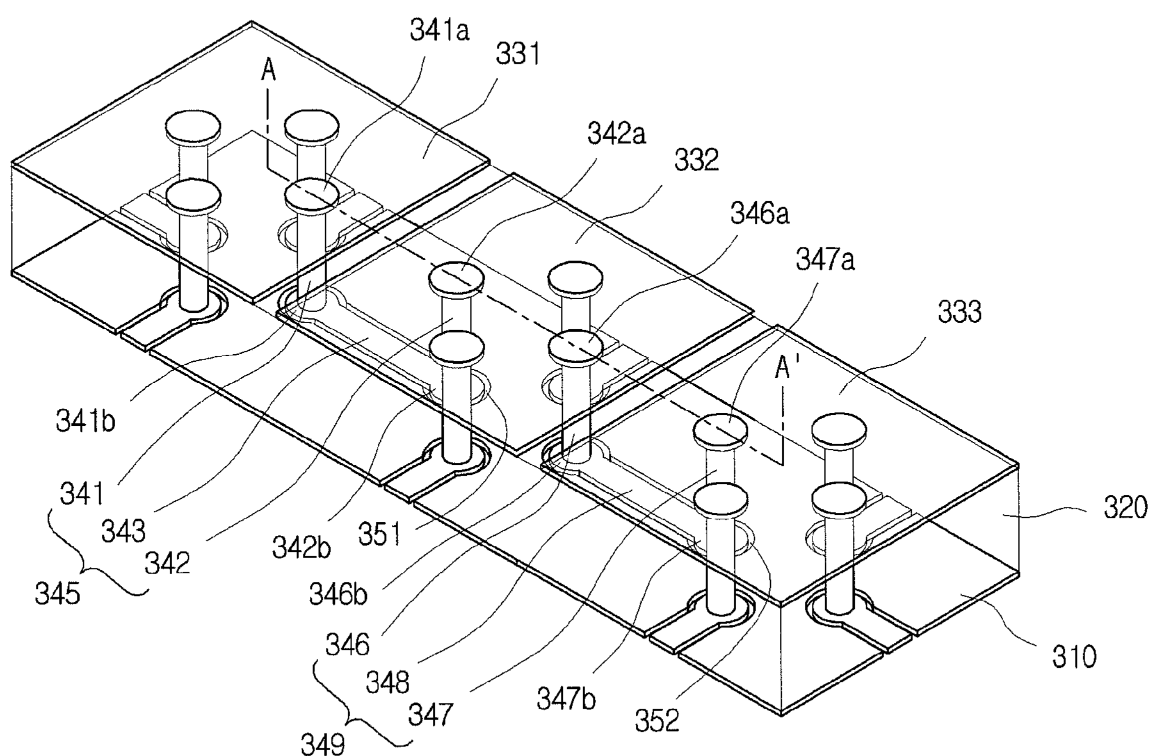
FIG. 3A is a perspective view showing an example of a two-layered electromagnetic bandgap structure having a stitching via.
Figure 3B:
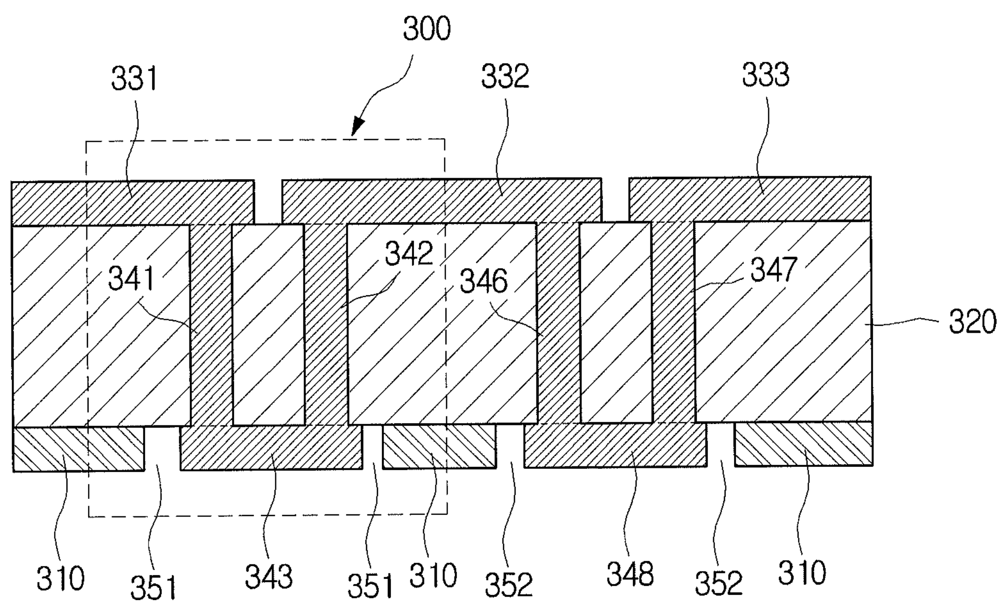
FIG. 3B shows a section viewed along the A-A' line of the two-layered electromagnetic bandgap structure having the stitching via of FIG. 3A.
Figure 3C:
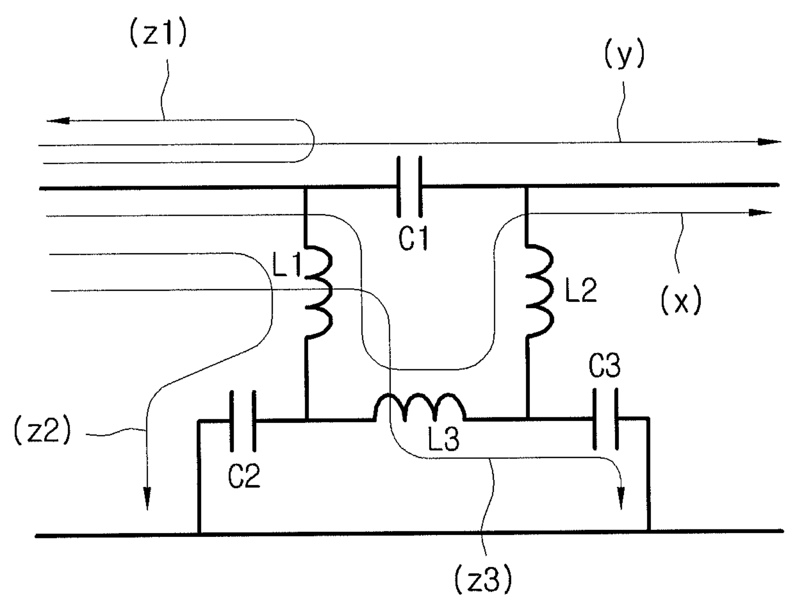
FIG. 3C shows an equivalent circuit of the two-layered electromagnetic bandgap structure having the stitching via of FIG. 3A.

In other words, the electromagnetic bandgap structure in accordance with each embodiment of the present invention can be considered as an extension and/or modification of the two-layered electromagnetic bandgap structure having a stitching via of FIG. 3A through FIG. 3C and the basic principle thereof (i.e. the principle of blocking a particular frequency band) in the form of being more suitable or more flexibly applicable to a multi-layered printed circuit board.

Accordingly, most (except for a two-layered structure) of the description related to FIG. 3A through FIG. 3C and FIG. 4A through 4E, which will be described below, can be equally or similarly applied to each of the embodiments of the present invention.

Although a metal layer and a metal plate are used throughout the description of the structure of an electromagnetic bandgap of the present invention, it shall be evidently understood by any person of ordinary skill in the art that any other conductive layers and plates can be substituted for the metal layer and the metal plate.

Although all of the foresaid drawings show that all metal plates are stacked on the same planar surface, it is not always necessary that all metal plates are stacked on the same planar surface. In case at least one of the metal plates is stacked on a planar surface that is different from the planar surface on which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

FIG. 3A shows the two-layered electromagnetic bandgap structure having the stitching via. FIG. 3B shows a section viewed along the A-A' line of the two-layered electromagnetic bandgap structure having the stitching via of FIG. 3A.

For an easy comparison with the electromagnetic bandgap structure (i.e. the electromagnetic bandgap structure of FIG. 5 through FIG. 8) in accordance with an embodiment of the present invention, the metal layer represented by reference numeral 310 is dubbed a first metal layer 310. Similarly, the metal plates represented by reference numerals 311, 332 and 333, the dielectric layer represented by reference numeral 320 and the stitching vias represented by reference numerals 345 and 349 are dubbed a first metal plate 331, a second metal plate 332, a third metal plate 333, a first dielectric layer 320, a first stitching via 345 and a second stitching via 349, respectively.

In FIG. 3A and FIG. 3B, the electromagnetic bandgap structure can include a plurality of metal plates 331, 332 and 333, a first metal layer 310 placed on a planar surface that is different from the planar surface on which the other metal plates are placed and stitching vias 345 and 349 electrically connecting any two adjacent ones of the plurality of metal plates to each other. The electromagnetic bandgap structure of FIG. 3A and FIG. 3B can have the two-layered structure having a first layer on which the first metal layer 310 is placed and a second layer on which the plurality of metal plates 331, 332 and 333 are placed. A first dielectric layer can be interposed between the first metal layer 310 and the plurality of metal plates 331, 332 and 333.

Here, FIG. 3A and FIG. 3B merely show elements constituting the electromagnetic bandgap structure (i.e. a part constituting the 2-layered electromagnetic bandgap having the stitching via) for the convenience of illustration. Accordingly, the first layer on which the first metal layer 310 is placed and the second layer on which the plurality of metal plates 331, 332 and 333 are placed, shown in FIG. 3A and FIG. 3B may be any two layers of a multi-layered printed circuit board.

In other words, it shall be obvious that there can be at least one additional metal layer below the first metal layer 310 and/or above the metal plates 331, 332 and 333.

For example, the electromagnetic bandgap structure shown in FIG. 3A and FIG. 3B can be placed between any two metal layers functioning as the power layer and the ground layer, respectively, in a multi-layered printed circuit board in order to block the conductive noise (the same can be applied to electromagnetic bandgap structures shown in FIG. 5 through FIG. 8 in accordance with other embodiments of the present invention).

Figure 5:
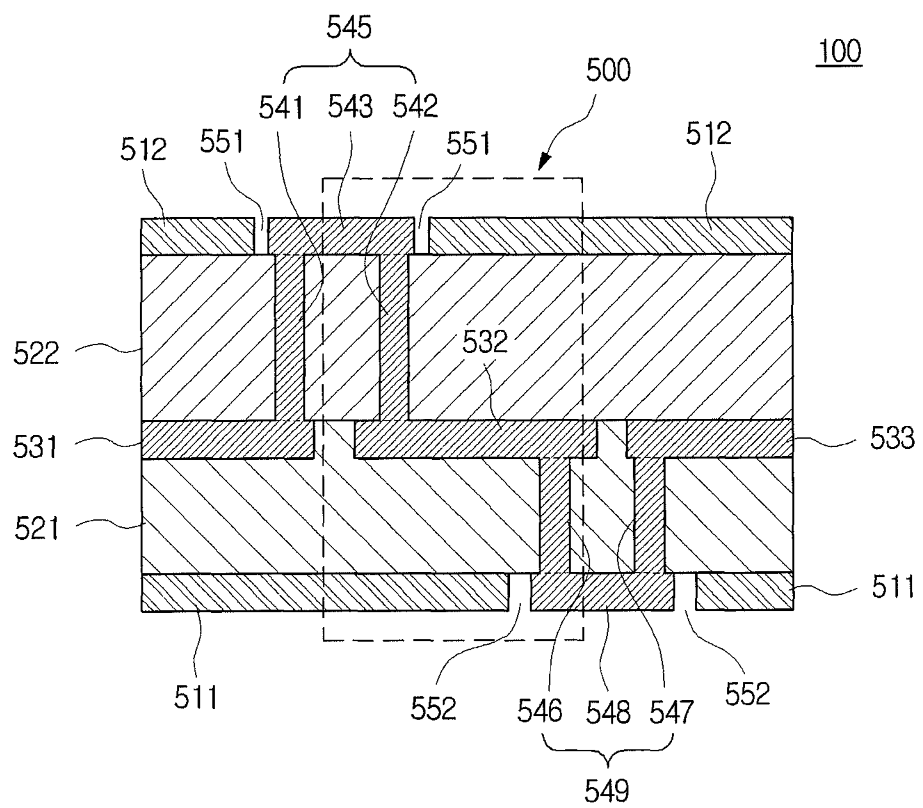
FIG. 5 is a plan view showing a multi-layered electromagnetic bandgap structure having a stitching via and a printed circuit board having the same in accordance with a first embodiment of the present invention.
Figure 8:
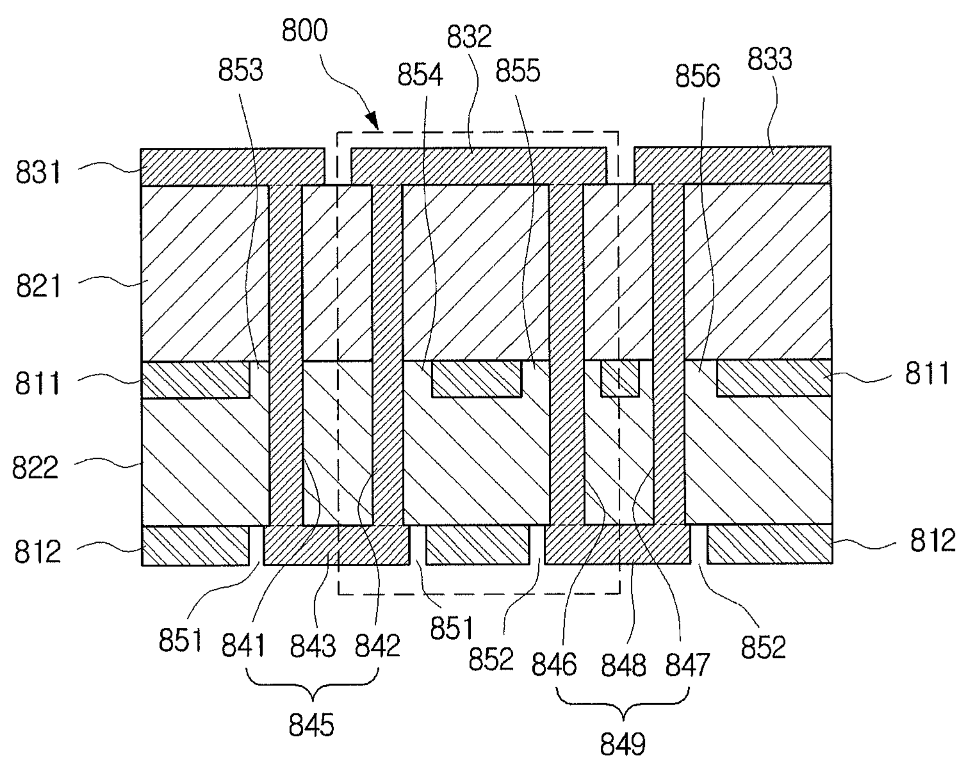
FIG. 8 is a plan view showing a multi-layered electromagnetic bandgap structure having a stitching via and a printed circuit board having the same in accordance with a fourth embodiment of the present invention.

Since the conductive noise problem is not limited to the space between the power layer and the ground layer, the electromagnetic bandgap structure shown in FIG. 3A and FIG. 3B and FIG. 5 though FIG. 8 can be placed between any two ground layers or power layers placed on different layers from each other in a multi-layered printed circuit board.

Accordingly, the first metal layer 310 may be any metal layer for transferring an electric signal in a printed circuit board. The first metal layer 310, for example, can be any metal layer functioning as the power layer or the ground layer or any metal layer functioning as a signal layer constituting a signal line.

The first metal layer 310 can be placed on a planar surface different from the planar surface in which the plurality of metal plates are placed and electrically separated from the plurality of metal plates 331, 332 and 333. In other words, the first metal layer 310 can form a layer that is different from the plurality of metal plates 331, 332 and 333 in regard to electrical signals in the printed circuit board.

For example, if the first metal layer 310 is the power layer, the metal plates can be electrically connected to the ground layer. If the first metal layer 310 is the ground layer, the metal plates can be electrically connected to the power layer. Alternatively, if the first metal layer 310 is the signal layer, the metal plates can be electrically connected to the ground layer. If the first metal layer 310 is the ground layer, the metal plates can be electrically connected to the signal layer.

The plurality of metal plates 331, 332 and 333 can be placed on a planar surface above the metal layer 310. Any two metal plates can be electrically connected to each other through a stitching via. As such, each stitching via electrically connecting any two metal plates to each other can electrically connect every metal plate as one circuit.

Here, FIG. 3A shows the form (i.e. the form of FIG. 4A) that a metal plate and its adjacent metal plates can be electrically connected to each other through each one stitching via, and as a result, every metal plate can be electrically connected to each other. However, as long all metal plates can be formed as a closed loop by being electrically connected to each other, it can be possible to use any method of connecting the metal plates to each other through the stitching via.

Even though FIG. 3A and FIG. 3B also show only two metal plates having square shapes of the same size for the convenience of illustration, various other modifications can be possible. This will be briefly described with reference to FIG. 4A through FIG. 4E.

Figure 4A:
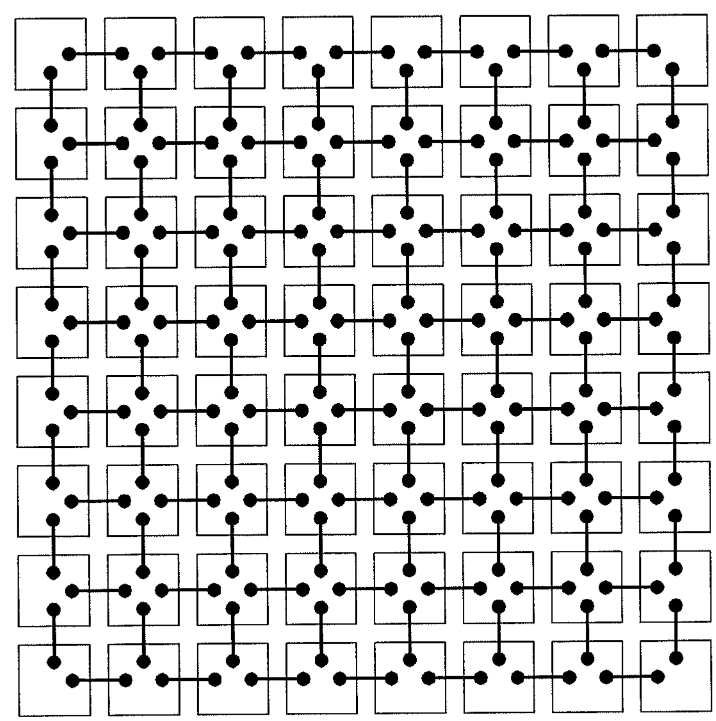
FIG. 4A is a plan view showing a configuration of an electromagnetic bandgap structure including a stitching via having a rectangular metal plate.
Figure 4B:
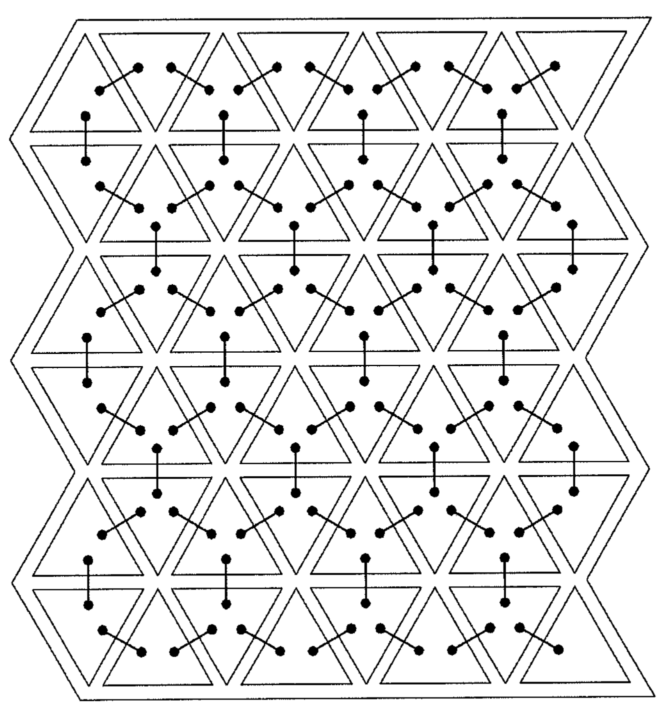
FIG. 4B is a plan view showing a configuration of an electromagnetic bandgap structure including a stitching via having a triangular metal plate.

For example, the metal plates can have various polygonal shapes including not only a rectangle as shown in FIG. 4A, and a triangle, as shown in FIG. 4B, but also a hexagon, an octagon. Of course, the metal plate may not be limited to a certain shape such as a circle or an ellipse. Each of the metal plates can also have the same size (e.g. area and thickness) as shown in FIG. 4A, FIG. 4B and FIG. 4E. If the metal plates have different sizes, the metal plates can be distinguished and disposed according to each of a plurality of groups having different sizes as shown in FIG. 4C or FIG. 4D.

Figure 4C:
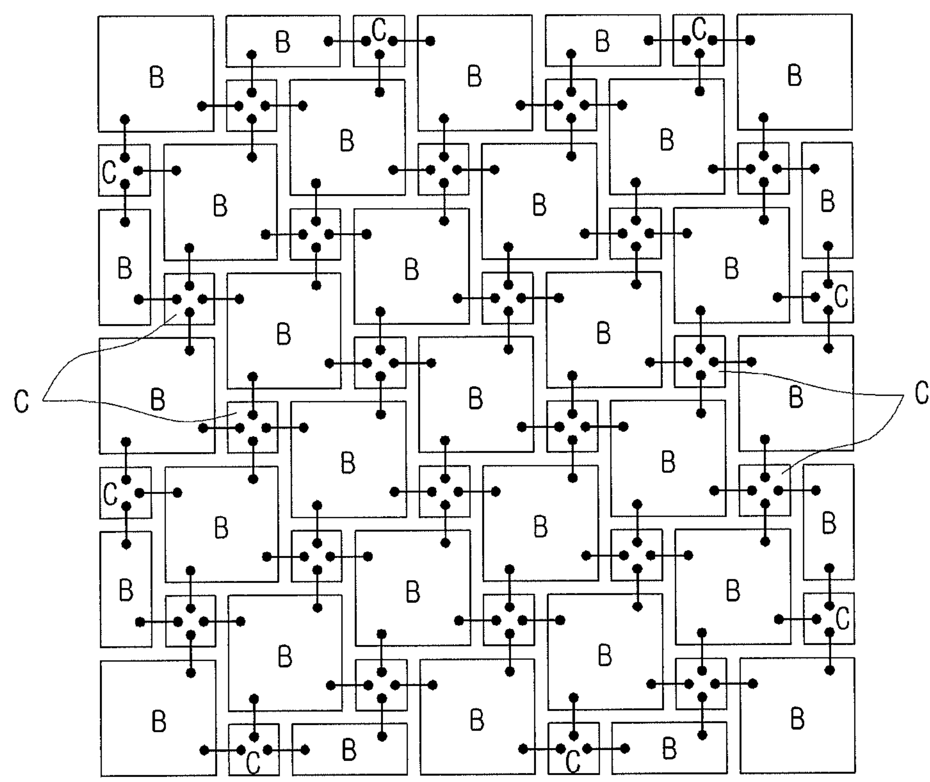
FIG. 4C and FIG. 4D are plan views showing a configuration of an electromagnetic bandgap structure including a stitching via having a plurality of groups having different-sized metal plates.

In the case of FIG. 4C, metal plates B having a relatively bigger size and metal plates C having a relatively smaller size can be alternately arranged, and each metal plate can be electrically connected to its adjacent metal plates through the stitching vias.

Figure 4D:
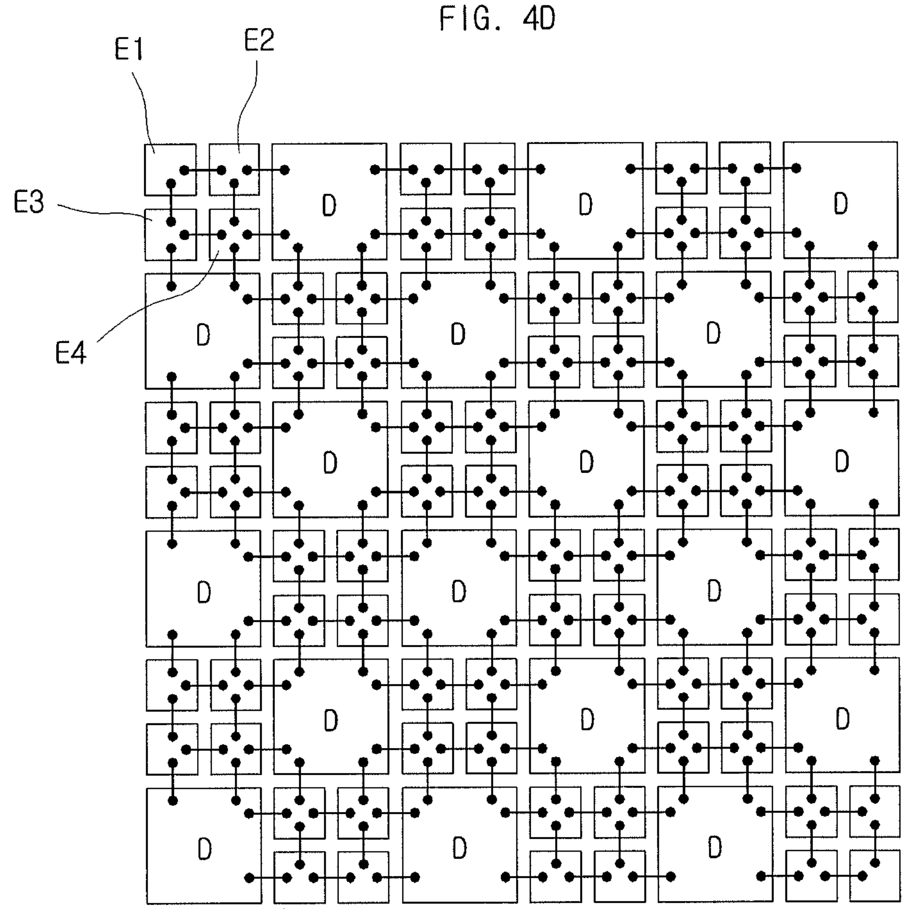
Figure 4E:
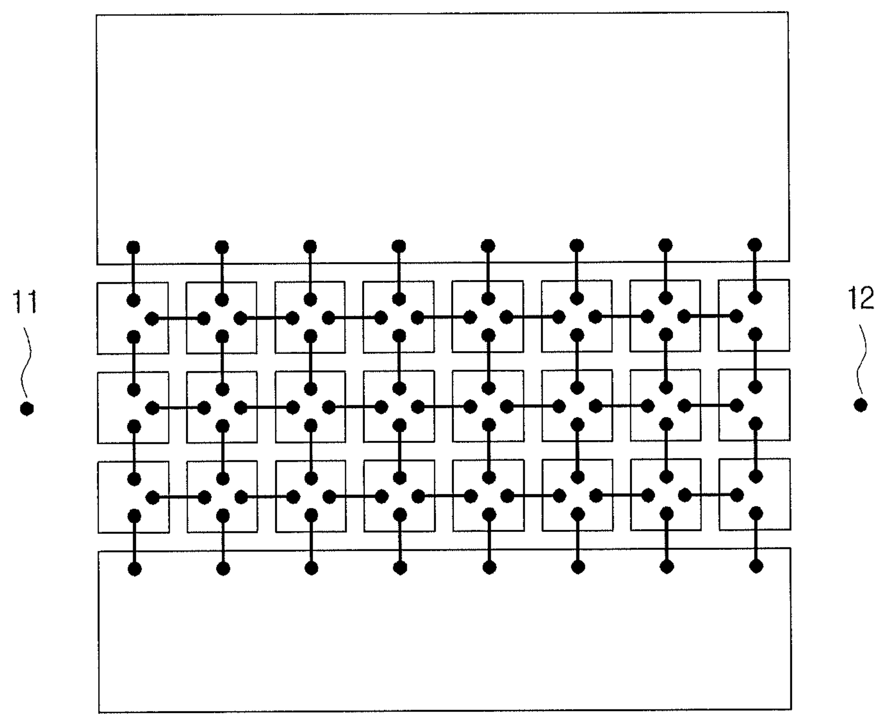
FIG. 4E is a plan view showing a band-shaped configuration of an electromagnetic bandgap structure including a stitching via.

In the case of FIG. 4D, metal plates D having a relatively bigger size and metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can occupy the area similar to the large metal plate D. The small metal plates E1, E2, E3 and E4 can be electrically connected to corresponding adjacent metal plates through 4 stitching vias. Moreover, since there are 8 small metal plates around the large metal plate D, the large metal plate D can be electrically connected to its adjacent small metal plates through 8 stitching vias.

Since FIG. 4A through FIG. 4E show each of the electromagnetic bandgap structures arranged in the printed circuit board when viewed from an upper surface, each one metal plate can correspond to each cell of the electromagnetic bandgap structure.

In particular, FIG. 4A through FIG. D show the case that the electromagnetic bandgap structures are repeatedly arranged on the whole part of an inner surface of the printed circuit board. FIG. 4E shows the case that the electromagnetic bandgap structures are arranged on a part of an inner surface of the printed circuit board.

Briefly, while the cells of the electromagnetic bandgap structures can be densely arranged on the whole part of an inner surface of the printed circuit board as shown in FIG. 4A through FIG. 4D, the cells can be arranged on some paths as shown in FIG. 4E.

For example, as shown in FIG. 4E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 4E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Here, if it is assumed that any two electronic circuits (in particular, two digital circuits) having different operation frequencies (refer to the first electronic circuit 130 and the second electronic circuit 140 in FIG. 1, described above) are implemented in the printed circuit board, the noise resource point and the noise blocking destination point can correspond to each position in which the two electronic circuits will be implemented.

A stitching via can electrically connect any two of a plurality of metal plates to each other. FIG. 3A and FIG. 3B and FIG. 4A through FIG. 4E show that the stitching via electrically connects two adjacent metal plates to each other. However, it may be unnecessary that any two metal plates connected by the stitching via are adjacent to each other.

Even though FIG. 3A also shows that one metal plate is connected to another metal plate by one stitching via, it is obviously unnecessary that the electromagnetic bandgap structure has any limitation to the number of the stitching vias connecting any two metal plates.

However, all below descriptions focus on the case that two adjacent metal plates are connected to each other by one stitching via.

When electrically connecting any two metal plates, the stitching via can electrically connect the two metal plates not on the same layer in which the metal plates 210*b* and 210*c* are placed but through a planar surface that is different from a planar surface in which the metal plates 331, 332 and 333 are placed.

It shall be evident here that, in order to allow the metal plates to be electrically connected to each other, it is necessary that a plating layer be formed on an inner wall only of the first via and the second via of the stitching via or the inside of the stitching via be filled with a conductive material (e.g. a conductive paste), and the connection pattern be a conductive material such as a metal.

The first stitching via 345 can electrically connect the first metal plate 331 to the second metal plate 332 in the order of the first metal plate 331→the first via 341→a connection pattern 343 placed on the same planar surface as the first metal layer 310 the second via 342→the second metal plate 332.

Similarly, the second stitching via 349 can electrically connect the second metal plate 332 to the third metal plate 333 in the order of the second metal plate 332→a first via 346→a connection pattern 348 placed on the same planar surface as the first metal layer 310→a second via 347→the third metal plate 333.

Herein, the first stitching via 345 can be formed to include a first via 341 formed to have one end part 341*a* connected to the first metal plate 331 and penetrate the first dielectric layer 320, a second via 342 formed to have one end part 342*a* connected to the second metal plate 332 and penetrate the first dielectric layer 320 and a connection pattern 343 placed to have one end part connected to the other end part 341*b* of the first via 341 and the other end part connected to the other end part 342*b* of the second via 342 and to be connected through a same planar surface as the first metal layer 310.

Similarly, the second stitching via 349 can be formed to include a first via 346 formed to have one end part 346*a* connected to the second metal plate 332 and penetrate the first dielectric layer 320, a second via 347 formed to have one end part 347*a* connected to the third metal plate 333 and penetrate the first dielectric layer 320 and a connection pattern 343 placed to have one end part connected to the other end part 341*b* of the first via 346 and the other end part connected to the other end part 342*b* of the second via 347 and to be connected through a same planar surface as the first metal layer 310.

As a result, the stitching via 345 and the second via 349 can be designed to have each predetermined part (e.g. the connection patterns 343 and 348) to be connected through a planar surface (e.g. the first metal plate 310) that is different from a planar surface on which the metal plates are placed in order to electrically connect the first metal plate 331 to the second metal plate 332 and the second metal plate 332 to the third metal plate 333, respectively.

At this time, a via land can be formed in one end part and the other end part of each of the vias 341 and 342, and 346 and 347 that forms the first stitching via 345 and the second stitching via 349, respectively. The via land can be formed to have a longer diameter than the via in order to reduce a position error of a drilling process for forming the via. FIG. 3A shows that one end part and the other end part of each via have a larger size than the via.

Moreover, the connection pattern 343 of the first stitching via 345 and the connection pattern 348 of the second stitching via 349 can be accommodated in clearance holes 351 and 352, respectively, formed on the first metal layer 310. This is because the first metal layer 310 may form a layer that is different from the metal plates in regard to electrical signals. As a result, each of the connection patterns 343 and 348 of the stitching via can be accommodated in clearance holes 351 and 352 formed on the first metal layer 310 to electrically disconnect the first metal layer 310 from the metal plates that are electrically connected to each other through the stitching via.

As described above, in the two-layered electromagnetic bandgap structure having the stitching via, one of any two metal plates 331 and 332 can be electrically connected to the other metal plate in series in the order of any one metal plate 331→the stitching via 345 (i.e. the first via 341→the connection pattern 343→the second via 342)→the other metal plate 332 based on any one dotted-line cell 300 in FIG. 3B. FIG. 3C shows an equivalent circuit of an electromagnetic bandgap structure having the above structure.

Comparing the equivalent circuit of FIG. 3C with the dotted-line cell 300 in FIG. 3B, an inductance component L1 can correspond to the first via 341, and an inductance component L2 can correspond to the second via 342. An inductance component L3 can correspond to the connection pattern 343. C1 can be a capacitance component caused by the metal plates 331 and 332 and another dielectric layer and another metal layer to be placed above the metal plates 331 and 332. C2 and C3 can be capacitance components caused by the first metal layer 310 placed in a side part of the connection pattern 343 and another dielectric layer and another metal layer to be placed below the first metal layer 310.

The electromagnetic bandgap structure shown in FIG. 3A and FIG. 3B can function as a band stop filter, which blocks a signal of a certain frequency band, according to the above equivalent circuit. In other words, as seen in the equivalent circuit of FIG. 3, a signal of a low frequency band (refer to x of FIG. 3C) and a signal of a high frequency band (refer to y of FIG. 3C) can pass through the electromagnetic bandgap structure, and signals of a certain frequency band (refer to z1, z2 and z3 of FIG. 3C) ranging between the low frequency band and the high frequency band are blocked by the electromagnetic bandgap structure.

It shall be noted here that the electromagnetic bandgap structure shown in FIGS. 3A and 3B has a two-layered structure including a stitching via and thus a wider, more various bandgap frequency band is possible due to a plurality of blocked paths (refer to z1, z2 and z3 of FIG. 3C) caused by 3 inductance components and 3 capacitance components. However, the aforementioned mushroom type electromagnetic bandgap structure of FIG. 2A and FIG. 2B has a simple blocked path (i.e. a simple path caused by one inductance component and one capacitance component), having a very limited and narrow bandgap frequency band.

Figure 2A:
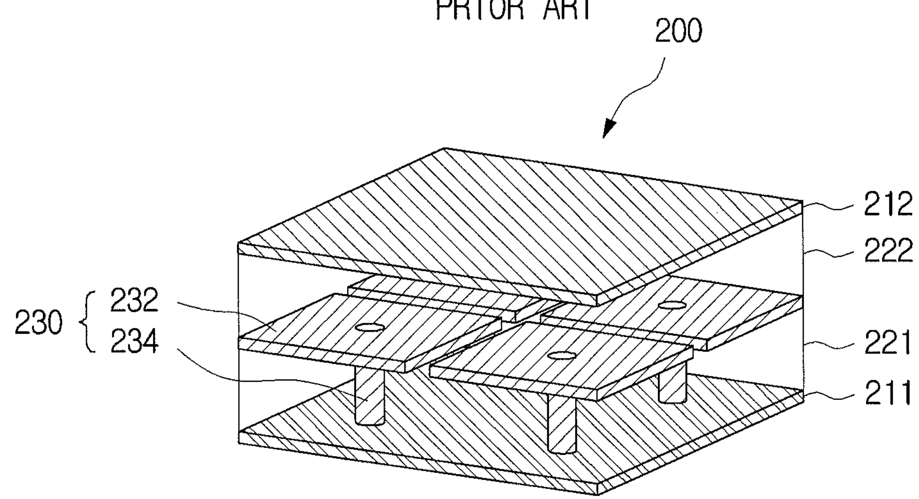
FIG. 2A and FIG. 2B are perspective views showing an electromagnetic bandgap structure having a mushroom type structure.
Figure 2B:
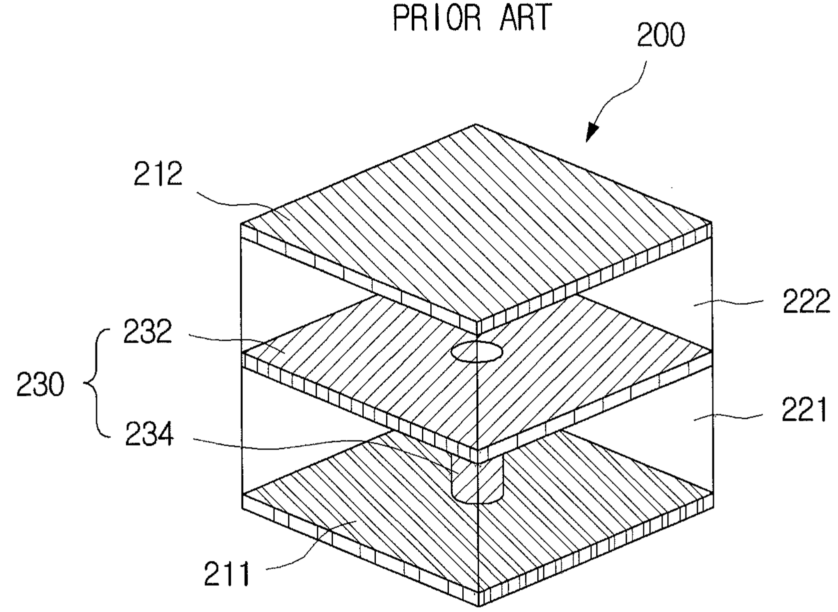
Figure 2C:
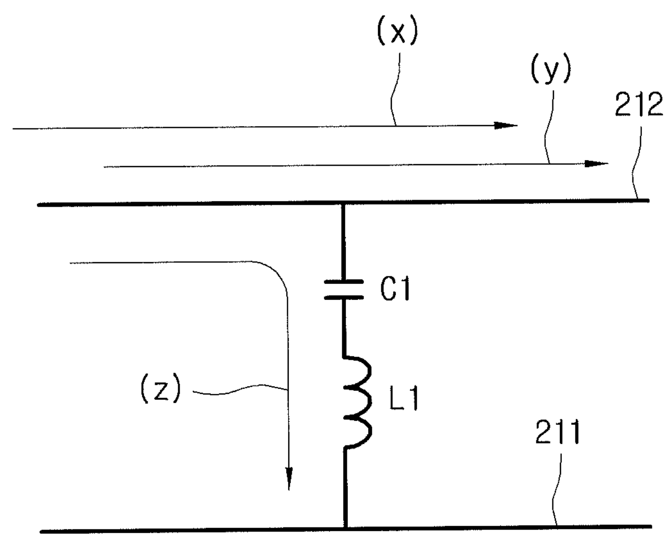
FIG. 2C shows an equivalent circuit of the electromagnetic bandgap structure shown in FIG. 2B.
Figure 2D:
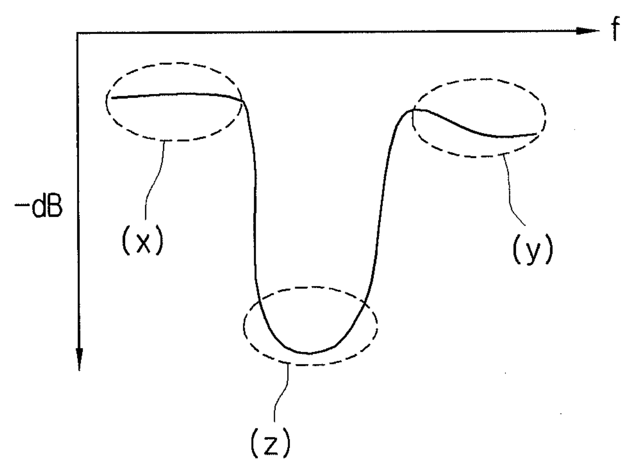
FIG. 2D is a graph showing a frequency property of the electromagnetic bandgap structure of FIG. 2B.

As such, the equivalent circuit of FIG. 3C obviously proves that the two-layered electromagnetic bandgap structure including the stitching via of FIG. 3A and FIG. 3B has the wider blocking range and better blocking efficiency than the mushroom type electromagnetic bandgap structure of FIG. 2A and FIG. 2B.

The electromagnetic bandgap structure having the stitching via can acquire a length of the via enough as compared with the mushroom type electromagnetic bandgap structure because adjacent metal plates are electrically connected to each other through the stitching via to be connected through a planar surface that is different from that of the metal plates. At this time, the acquirable length of the stitching via can be in proportion to an inductance value that can be acquired soon. Accordingly, it can be possible to adjust the inductance value enough in the electromagnetic bandgap structure.

In addition, since the adjacent metal plates are electrically connected to each other through the stitching via to be connected through a planar surface that is different from that of the metal plates, it may be unnecessary that a pattern for connecting the metal plates to each other is formed on the same planar surface as the metal plates. This can make spaced gaps between the metal plates narrower. The narrower spaced gaps between the metal plates can cause a capacitance value of the gap to rise proportionally. Accordingly, it can be possible to adjust the capacitance value enough in the electromagnetic bandgap structure.

In the equivalent circuit of FIG. 3, the value of each capacitance component can be varied according to various factors such as a spaced gap between the metal plate and the metal layer, a spaced gap between adjacent metal plates, a dielectric constant of a dielectric material forming a dielectric layer interposed between the metal layers or the metal layer and the metal plate and the size, shape and area of the metal plate. The value of the inductance component can be also varied according to various factors such as the shape, length, diameter, thickness and width of each via and the connection pattern forming the stitching via.

Accordingly, adjusting and designing various aforementioned factors adequately can make it possible to allow the structure of FIG. 3A and FIG. 3B to universally function as the electromagnetic bandgap structure (i.e. a band stop filter) for removing or blocking a certain noise or a certain signal of an object frequency band.

Accordingly, if the structure of FIG. 3A and FIG. 3B is repeatedly arranged on a whole part (refer to FIG. 4A through FIG. 4D) or a part (refer to FIG. 4E) of an inner surface of the printed circuit board (the same can be applied to the structure of FIG. 5 through FIG. 8, described below) as a noise transferable path, it is possible to function as the electromagnetic bandgap structure that can prevent a signal of a certain frequency band from being transferred.

The electromagnetic bandgap structure including the stitching via, which has the two-layered structure including an upper layer in which the plurality of metal layer 331, 332 and 333 are placed, a lower layer in which the first metal layer 310 is placed and the first dielectric layer 320 placed therebetween, has been described above with reference to FIG. 3A and FIG. 3B.

However, it may be unnecessary that the electromagnetic bandgap structure having the stitching via has the same shape and structure as shown in FIG. 3A and FIG. 3B.

For example, it may be unnecessary that the electromagnetic bandgap structure having a stitching via include a metal layer (refer to 310 of FIG. 3A and FIG. 3B), placed below an area in which there is the stitching via and. This may be because it is not always necessary that the connection pattern of the stitching via be formed on a space in which there is the metal layer.

In other words, if there is a metal layer on the same planar surface to correspond to an area on which the connection pattern will be formed, the connection pattern can be manufactured in the form of being accommodated in the clearance hale (refer to 351 and 352 of FIG. 3A and FIG. 3B) formed in the metal layer (refer to 310 of FIG. 3A and FIG. 3B) on the same planar surface. However, no additional metal may be placed in the area in which the connection pattern will be formed (refer to FIG. 10B described below).

Moreover, it may not be always necessary that the 2-layered electromagnetic bandgap structure including the stitching via is formed to have the same stacked structural form as shown in FIG. 3A and FIG. 3B. In other words, the 2-layered electromagnetic bandgap structure having the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural form, with the position of the upper layer and the lower layer inversed from that of FIG. 3A and FIG. 3B.).

Of course, the identical or similar noise blocking effect can be expected.

Hereinafter, each embodiment of an electromagnetic bandgap structure and a printed circuit board having the same will be described with reference to FIG. 5 through FIG. 8. However, any matter already described in FIG. 3A through FIG. 4E will be not be redundantly described, and the electromagnetic bandgap structure and the printed circuit board including the same will be briefly described based on the features of each embodiment of the present invention.

This is, as described above, because all technical idea/principle except for the point that the electromagnetic bandgap structure having the stitching via employs the two-layered structure of FIG. 3A and FIG. 3B can be equally applied to each of the embodiments of the present invention of FIG. 5 through FIG. 8.

For the convenience of FIG. 5 through FIG. 8, it shall be noted that FIG. 5 through FIG. 8 are sectional views showing some metal layers directly related to an area in which the electromagnetic bandgap structure of the present invention is placed among a plurality of metal layers of a multi-layered printed circuit board (refer to 100 of FIG. 5 through FIG. 8). Accordingly, it shall be obvious that at least another metal layer can be placed above a top layer and/or below a bottom layer in FIG. 5 through FIG. 8.

For the convenience of illustration and understanding of the invention, in FIG. 5 through FIG. 8, only three metal plates are shown, and one metal plate is electrically connected to another adjacent metal plate and yet another adjacent metal plate through one stitching via each (i.e. two adjacent cells around one cell are connected).

In other words, the electromagnetic bandgap structure in accordance with each embodiment of the present invention, as described with reference to FIG. 4A through FIG. 4E can be arranged to have various shapes, sizes and configurations in some or all parts of the board. This can be clearly understood by any person of ordinary skill in the art through the overall intent of the present invention.

Accordingly, the electromagnetic bandgap structure and the printed circuit board having the same will be described below based on the case of connecting two adjacent cells around one cell (i.e. a dotted-line cell 500, 600, 700 or 800).

Figure 10A:
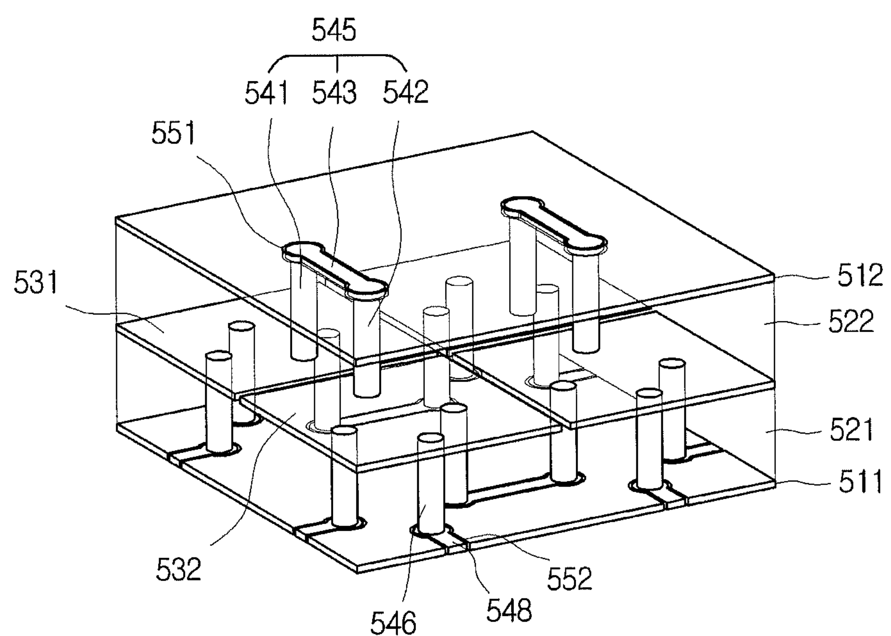
FIG. 10A is a 3-D perspective view showing the electromagnetic bandgap structure of FIG. 5.

FIG. 5 is a plan view showing a multi-layered electromagnetic bandgap structure having a stitching via and a printed circuit board having the same in accordance with a first embodiment of the present invention. FIG. 10A is a 3-D perspective view showing the electromagnetic bandgap structure of FIG. 5.

The electromagnetic bandgap structure according to a first embodiment of the present invention can include two metal layers 511 and 512, a plurality of metal plates 531, 532 and 533 placed on a planar surface between the two metal layers 511 and 512, a first stitching via 545 electrically connecting one metal plate 532 to another metal plate 531 and a second stitching via 549 electrically connecting the one metal plate 532 to yet another metal plate 533.

A dielectric layer 521 and a dielectric layer 522 can be interposed between the metal layer 512 and the plurality of metal plates 531, 532 and 533 and between the plurality of metal plates 531, 532 and 533 and the metal layer 511, respectively.

For the convenience of describing the drawings and comparison with the structure of the electromagnetic bandgap of FIG. 3A and FIG. 3B, the metal layer represented by the reference numeral 511, the metal layer represented by the reference numeral 512, the metal plate represented by 531, the metal plate represented by 532, the metal plate represented by the reference numeral 533, the dielectric layer represented by the reference numeral 521 and the dielectric layer represented by the reference numeral 522 can be renamed as a first metal layer 511, a second metal layer 512, a first metal plate 531, a second metal plate 532, a third metal plate 533, a first dielectric layer 521 and a second dielectric layer 522, respectively.

When electrically connecting any two metal plates, each of the stitching vias of the electromagnetic bandgap structure of FIG. 5 through FIG. 10 does not electrically connect the two metal plates on the same layer on which the metal plates are placed, but each of the stitching vias can electrically connect the metal plates to each other by allowing a part of the pertinent stitching via to be connected through a planar surface that is different from a planar surface on which the metal plates are placed, similarly to each of the stitching via of the electromagnetic bandgap structure of FIG. 3A and FIG. 3B.

In the electromagnetic bandgap structure of FIG. 5 through FIG. 10, however, the first stitching via 545 and the second stitching via 549, which connects any one metal plate to another metal plate and yet another metal plate, respectively, can to be connected through one planar surface and another planar surface, respectively, which are placed in different directions from each other, around the planar surface on which the metal plates 531, 532 and 533 are placed. This is structurally different from the electromagnetic bandgap structure of FIG. 3A and FIG. 3B.

In other words, the electromagnetic bandgap structure of FIG. 5 through FIG. 10 can have a three-layered structure including a first layer in which the first metal layer 511 is placed, a second layer in which the metal plates 531, 532 and 533 are placed and a third layer in which the second metal layer 512 is placed, unlike the electromagnetic bandgap structure of FIG. 3A and FIG. 3B.

Accordingly, the first stitching via 545 can electrically connect the second metal plate 532 to the first metal plate 531 by allowing a part (refer to 543) of the first stitching via 545 to be connected through a same planar surface as the second metal layer 512, which is different from and placed above a planar surface in which the metal plates 531, 532 and 533 are placed. The second stitching via 549 can allow a part (refer to 548) of the second stitching via 549 to be connected through a same planar surface as the first metal layer 511, which is different from and placed below the planar surface in which the metal plates 531, 532 and 533 are placed so as to electrically connect the second metal plate 532 and the third metal plate 533.

Herein, the first stitching via 545 can be formed to include a first via 541 formed to have one end part connected to the first metal plate 531 and penetrate the second dielectric layer 522, a second via 542 formed to have one end part connected to the second metal plate 532 and penetrate the second dielectric layer 522 and a connection pattern 543 placed to have one end part connected to the other end part of the first via 541 and the other end part connected to the other end part of the second via 542 and to be connected through a same planar surface as the second metal layer 512.

The second stitching via 549 can be also formed to include a first via 546 formed to have one end part connected to the second metal plate 532 and penetrate the first dielectric layer 521, a second via 547 formed to have one end part connected to the third metal plate 533 and penetrate the first dielectric layer 521 and a connection pattern 548 placed to have one end part connected to the other end part of the first via 546 and the other end part connected to the other end part of the second via 547 and to be connected through a same planar surface as the first metal layer 511. Here, the first metal layer 511 or second metal layer 512 can form a layer that is different from the metal plates 531, 532 and 533 in regard to electrical signals in a printed circuit board. As described above with reference to FIG. 3A through FIG. 3C, for example, the first metal layer 511 and the second metal layer 512 can function as a power layer or a signal layer, and the metal plates 531, 532 and 533 can function as a ground layer in a printed circuit board, or vice versa.

In this case, it may be necessary that the metal plates 531, 532 and 533 be disconnected from the first metal layer 511 and the second metal layer 512, respectively, by allowing the connection pattern 543 of the first stitching via 545 and the connection pattern 548 of the second stitching via 549 to be accommodated in a clearance hole 551 formed on the second metal layer 512 and a clearance hole 552 formed on the first metal layer 511, respectively, as shown in FIG. 5.

The metal plates 531, 532 and 533 can be connected by the two stitching vias 545 and 549, each of which connects any one metal plate to two adjacent metal plates, in the order of the first metal plate 531→the first stitching via 545 (i.e. the first via 541→a connection pattern 543 placed on the same planar surface as the second metal plate 512→the second via 542) →the second metal plate 532→the second stitching via 549 (i.e. the first via 546→a connection pattern 548 placed on the same planar surface as the first metal plate 511→the second via 547)→the third metal plate 533.

At this time, each of the first stitching via 545 and the second stitching via 549, which extends from the metal plates 531, 532 and 533 in different directions, can function as an inductance component. The metal plates 531, 532 and 533, the first metal layer 511 and the first dielectric layer 521 placed therebetween can function as a capacitance component. Similarly, the metal plates 531, 532 and 533, the second metal layer 512 and the second dielectric layer 522 placed therebetween can function as a capacitance component.

Accordingly, if the structure of FIG. 5 is repeatedly arranged on a whole part (refer to FIG. 4A through FIG. 4D) or a part (refer to FIG. 4E) of an inner surface of the printed circuit board as a noise transferable path, it is possible to function as the electromagnetic bandgap structure that can prevent a signal of a certain frequency band from being transferred.

Figure 10B:
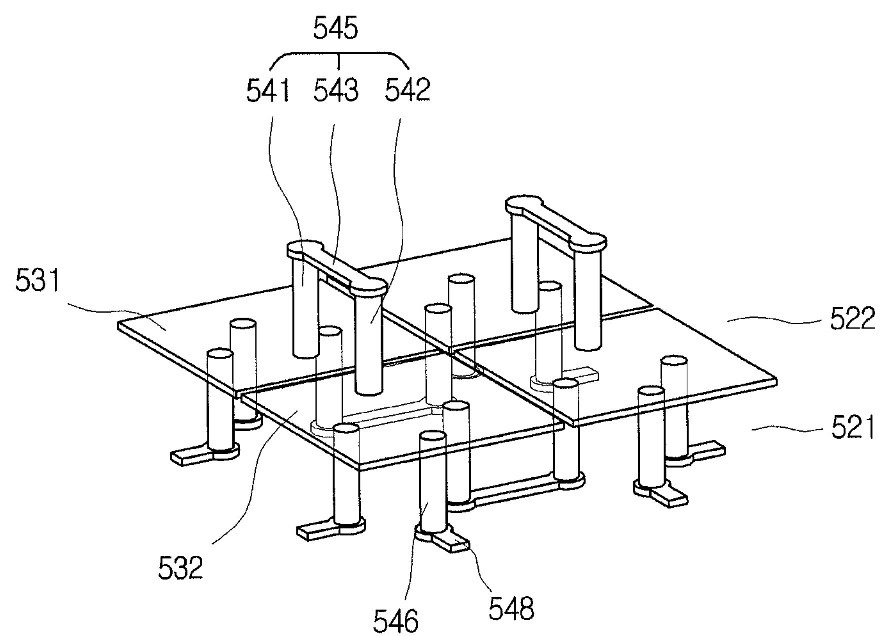
FIG. 10B shows the 3-D perspective view of FIG. 10A without a metal layer.

In addition, FIG. 10B shows the 3-D perspective view of FIG. 10A without the first metal layer 511 and the second metal layer 512. This shows it is not always necessary that an additional metal layer be closely formed below and above an area in which the electromagnetic structure (i.e. the metal plates and stitching vias) of the present invention will be arranged. In the case of FIG. 10B, it is obviously unnecessary that no additional clearance hole is formed in an area in which the connection pattern of the stitching via will be formed unlike FIG. 5A and FIG. 10A.

Figure 6:
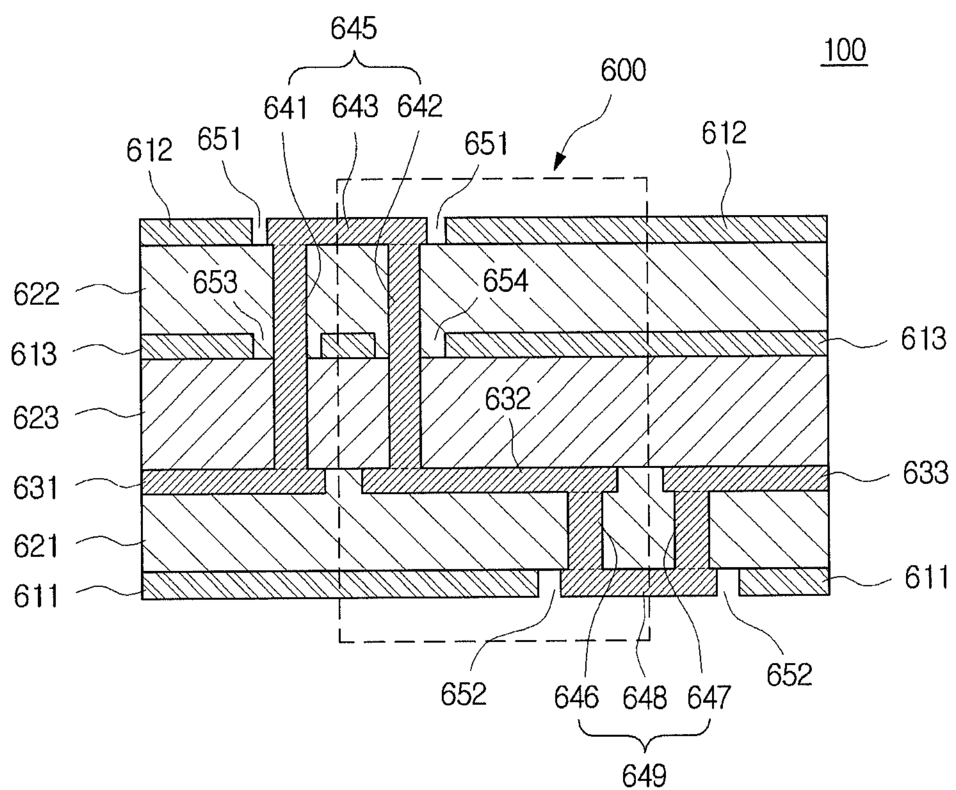
FIG. 6 is a plan view showing a multi-layered electromagnetic bandgap structure having a stitching via and a printed circuit board having the same in accordance with a second embodiment of the present invention.
Figure 11A:
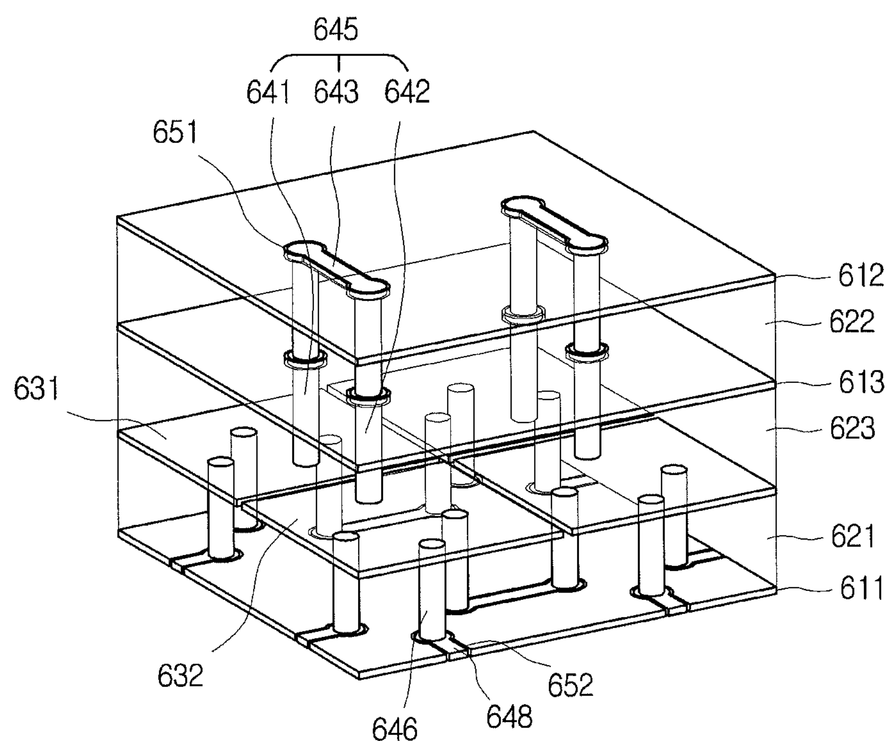
FIG. 11A is a 3-D perspective view showing the electromagnetic bandgap structure of FIG. 6.

FIG. 6 is a plan view showing a multi-layered electromagnetic bandgap structure having a stitching via and a printed circuit board having the same in accordance with a second embodiment of the present invention. FIG. 11A is a 3-D perspective view showing the electromagnetic bandgap structure of FIG. 6.

The electromagnetic bandgap structure according to a second embodiment of the present invention can include three metal layers 611 and 612, a plurality of metal plates 631, 632 and 633 placed on a planar surface between any two metal layers 611 and 612, a first stitching via 645 electrically connecting one metal plate 632 to another metal plate 631 and a second stitching via 649 electrically connecting the one metal plate 632 to yet another metal plate 633.

The electromagnetic bandgap structure in accordance with the second embodiment of the present invention can feature the additional metal layer that is placed between at least one of the two metal layers 611 and 612 and the metal plates 631, 632 and 633. FIG. 6 is an example showing that the additional metal layer represented by the reference numeral 613 is placed between the metal layer represented by the reference numeral 612 and the metal plates 631, 632 and 633.

A dielectric layer 621, a dielectric layer 622 and 623 can be interposed between the metal layer 611 and the metal plates 631, 632 and 633, between the metal plates 631, 632 and 633 and the metal layer 613 and between the metal layer 613 and the metal layer 612, respectively.

For the convenience of describing the drawings and comparison with the structure of the electromagnetic bandgap of FIG. 3A, FIG. 3B and FIG. 5, the metal layer represented by the reference numeral 611, the metal layer represented by the reference numeral 612, the metal layer represented by the reference numeral 613, the metal plate represented by the reference numeral 631, the metal plate represented by the reference numeral 632, the metal plate represented by the reference numeral 633, the dielectric layer represented by the reference numeral 621, the dielectric layer represented by the reference numeral 622 and the dielectric layer represented by the reference numeral 623 can be re-named as a first metal layer 611, a second metal layer 612, a third metal layer 613 a first metal plate 631, a second metal plate 632, a third metal plate 633, a first dielectric layer 521, a second dielectric layer 622 and a third dielectric layer 623, respectively.

In FIG. 6 and FIG. 11A, the first stitching via 645 can electrically connect the second metal plate 632 to the first metal plate 631 by allowing a part (refer to 643) of the first stitching via 645 to be connected through a same planar surface as the second metal layer 612, which is different from and placed above a planar surface in which the metal plates 631, 632 and 633 are placed. The second stitching via 649 can allow a part (refer to 648) of the second stitching via 649 to be connected through a same planar surface as the first metal layer 611, which is different from and placed below the planar surface in which the metal plates 631, 632 and 633 are placed so as to electrically connect the second metal plate 632 and the third metal plate 633.

As such, the electromagnetic bandgap structure in accordance with the second embodiment of the present invention can be formed to include a plurality of metal plates and two stitching vias, each of which is placed on the same planar surface and connected through any two metal layers located above and below the metal plates, identically to the aforementioned electromagnetic bandgap structure in accordance with the first embodiment of the present invention.

However, the electromagnetic bandgap structure in accordance with the second embodiment of the present invention can features at least one additional metal layer (e.g. the second metal layer 613 in FIG. 6) that is placed between at least one (e.g. the second metal layer 612 in FIG. 6) of the two metal layers 611 and 612 and the metal plates 631, 632 and 633 as compared with the electromagnetic bandgap structure in accordance with the first embodiment of the present invention.

On the other hand, in accordance with the first embodiment of the present invention, the first stitching via 545 and the second stitching via 549 can to be connected through the second metal layer 512 and the first metal layer 511, respectively, which are most adjacently placed above and below the metal plates 531, 532 and 533.

In FIG. 6A and FIG. 11A, a first via 641 of the first stitching via 645 can be formed to have one end part connected to the first metal plate 631 and to penetrate the third dielectric layer 623, the third metal layer 613 and the second dielectric layer 622. A second via 642 of the first stitching via 645 can be formed to have one end part connected to the second metal plate 632 and to penetrate the third dielectric layer 623, the third metal layer 613 and the second dielectric layer 622. A connection pattern 643 of the first stitching via 645 can be formed to have one end part connected to the other end part of the first via 641 and the other end part connected to the other end part of the second via 642 and to be connected through the same planar surface as the second metal layer 612.

The second stitching via 649 can be formed to include a first via 646 formed to have one end part connected to the second metal plate 632 and penetrate the first dielectric layer 621, a second via 647 formed to have one end part connected to the third metal plate 633 and penetrate the first dielectric layer 621 and a connection pattern 648 placed to have one end part connected to the other end part of the first via 646 and the other end part connected to the other end part of the second via 647 and to be connected through a same planar surface as the first metal layer 611.

At this time, each of the first metal layer 611, the second metal layer 612 and the third metal layer 613 can form a layer that is different from the metal plates 631, 632 and 633 in regard to electrical signals in a printed circuit board. For example, the first metal layer 611, the second metal layer 612 and the third metal layer 613 can function as a power layer, and the metal plates 631, 632 and 633 can function as a ground layer.

In this case, it may be necessary that the metal plates 631, 632 and 633 be disconnected from the first metal layer 611 and the second metal layer 612, respectively, by allowing the connection pattern 643 of the first stitching via 645 and the connection pattern 648 of the second stitching via 649 to be accommodated in a clearance hole 651 formed on the second metal layer 612 and a clearance hole 652 formed on the first metal layer 611, respectively, as shown in FIG. 6.

Similarly, in FIG. 6 and FIG. 11A, the first via 641 and the second via 642 of the first stitching via 645 may be required to be formed to penetrate the third metal layer 613. Accordingly, it may be necessary that the first via 641 and the second via 642 of the first stitching via 645 be formed to penetrate a clearance hole 653 and a clearance hole 654, respectively, which are formed on the third metal layer 613 so as to electrically disconnect the third metal layer 613 from the metal plates 631, 632 and 633.

Here, each of the first stitching via 645 and the second stitching via 649, which extends from the metal plates 631, 632 and 633 in different directions and different lengths, can function as each of the inductance components having different values in proportion to the lengths. The metal plates 631, 632 and 633, the first metal layer 611 and the first dielectric layer 621 placed therebetween can function as a capacitance component. Similarly, the metal plates 631, 632 and 633, the second metal layer 612 and the second dielectric layer 622 placed therebetween can function as a capacitance component.

Moreover, since FIG. 6 and FIG. 11A show that the additional metal layer, which is the third metal layer 613, is placed between the metal plates 631, 632 and 633 and the second metal layer 612, there may be further the capacitance component caused by the third metal layer 613, the dielectric layer 622 and the second metal layer 612. This may be because the electromagnetic bandgap structure of FIG. 6 has a 4-layered structure including the first metal layer 611 as a first layer, the metal plates 631, 632 and 633 as a second layer, the third metal layer 613 as a third layer and the second metal layer 612 as a fourth layer. Of course, it shall be obvious that the electromagnetic bandgap structure of FIG. 6A and FIG. 11A can have 5 or more-layered structure in proportion to the number of metal layers to be placed between the metal plates 631, 632 and 633 and any one metal layer.

Accordingly, if the structure of FIG. 6 is repeatedly arranged on a whole part (refer to FIG. 4A through FIG. 4D) or a part (refer to FIG. 4E) of an inner surface of the printed circuit board as a noise transferable path, it is possible to function as the electromagnetic bandgap structure that can prevent a signal of a certain frequency band from being transferred.

The first stitching via 645 and the second stitching via 649 are also designed to have different lengths according to the electromagnetic bandgap structure of FIG. 6 and FIG. 11A, thereby acquiring two bandgap frequencies having different bands. This can be clearly understood through the frequency property graph of FIG. 9, described below.

Figure 11B:
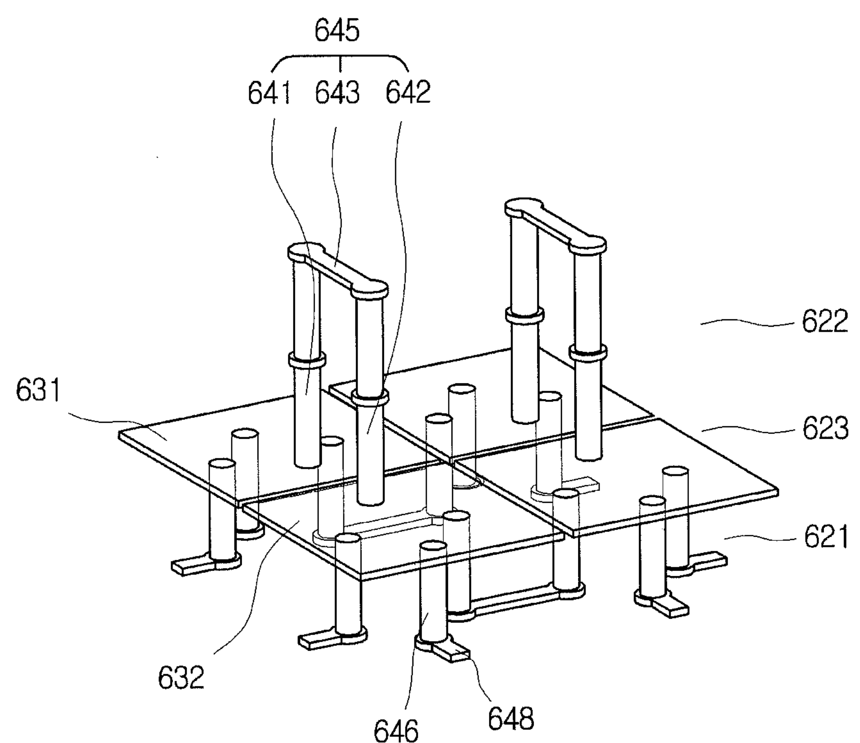
FIG. 11B shows the 3-D perspective view of FIG. 10A without a metal layer.

In addition, FIG. 11B shows the 3-D perspective view of FIG. 11A without the first metal layer 611, the second metal layer 612 and the third metal layer 613. As described above, this shows it is not always necessary that an additional metal layer be closely formed below and above an area in which the electromagnetic structure (i.e. the metal plates and stitching vias) of the present invention will be arranged. The same can be applied to FIG. 7 and FIG. 8, described below, in spite of no additional drawing.

Figure 7:
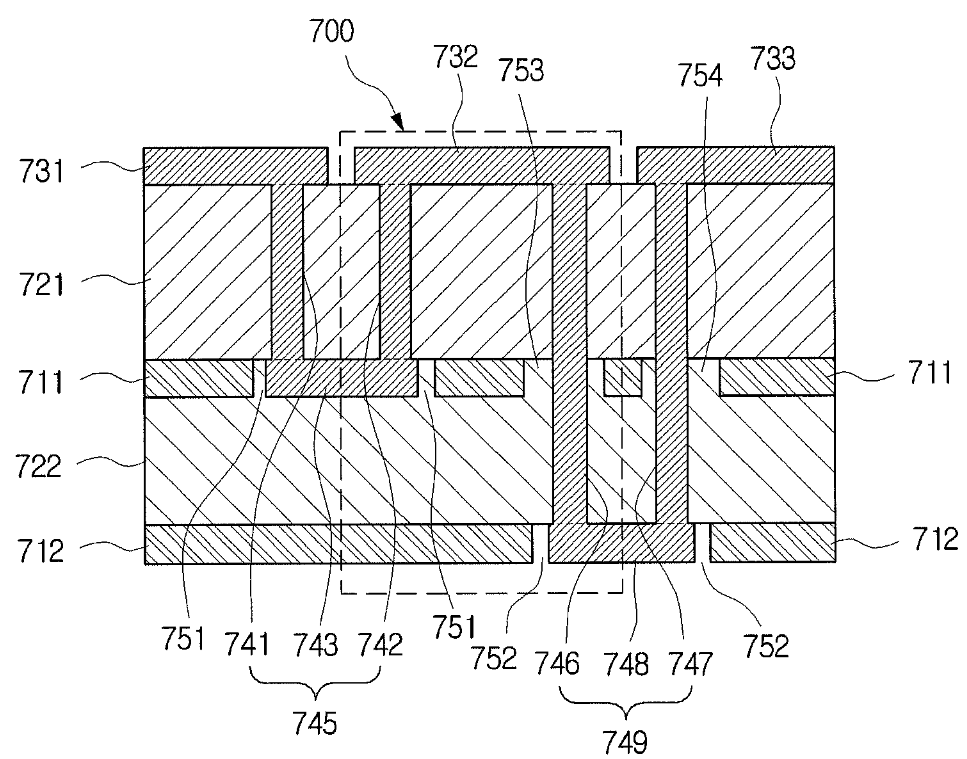
FIG. 7 is a plan view showing a multi-layered electromagnetic bandgap structure having a stitching via and a printed circuit board having the same in accordance with a third embodiment of the present invention.

FIG. 7 is a plan view showing a multi-layered electromagnetic bandgap structure having a stitching via and a printed circuit board having the same in accordance with a third embodiment of the present invention.

The electromagnetic bandgap structure in accordance with a third embodiment of the present invention can include a plurality of metal plates 731, 732 and 733 placed on any one planar surface of a printed circuit board, two metal layers 711 and 712 placed on different planar surfaces below the planar surface on which the metal plates 731, 732 and 733 are stacked, a first stitching via 745 electrically connecting any one 732 of the metal plates 731, 732 and 733 to another metal plate 731 and a second stitching via 749 electrically connecting any one metal plate 732 to yet another metal plate 733.

A dielectric layer 721 and a dielectric layer 722 can be interposed between the metal plates 731, 732 and 733 and any one metal plate 711 and between the two metal layers 711 and 712.

For the convenience of describing the drawings and comparison with the structure of the electromagnetic bandgap of FIG. 3A, FIG. 3B, FIG. 5 and FIG. 6, the metal layer represented by the reference numeral 711, the metal layer represented by the reference numeral 712, the metal plate represented by the reference numeral 731, the metal plate represented by the reference numeral 732, the metal plate represented by the reference numeral 733, the dielectric layer represented by the reference numeral 721 and the dielectric layer represented by the reference numeral 722 can be renamed as a first metal layer 711, a second metal layer 712, a first metal plate 731, a second metal plate 732, a third metal layer 733, a first dielectric layer 721 and a second dielectric layer 722.

Moreover, FIG. 7 is merely an example showing that the first metal layer 711 and the second metal layer 712 are placed on different planar surfaces below the metal plates 731, 732 and 733. In the electromagnetic bandgap structure in accordance with the third embodiment of the present invention, the first metal layer 711 and the second metal layer 712 can be alternatively placed on different planar surfaces above the metal plates 731, 732 and 733. The same can be applied to an electromagnetic bandgap structure in accordance with a fourth embodiment of the present invention.

In addition, even though FIG. 7 shows that the first metal layer 711 is placed most adjacently to the metal plates 731, 732 and 733, and the second metal layer 712 is placed most adjacently to the first metal layer 711 for example, it shall be obvious that at least one additional metal layer can be placed between the first metal layer 711 and the metal layer 731, 732 and 733 and between the first metal layer 711 and the second metal layer 712. The same can be also applied to the electromagnetic bandgap structure in accordance with the fourth embodiment of the present invention.

The electromagnetic bandgap structure of FIG. 7 can have a three-layered structure including the second metal layer 712 as a first layer, the metal layer 711 as a second layer and the metal plates 731, 732 and 733 as a third layer. However, unlike the electromagnetic bandgap structure of FIG. 5, the electromagnetic bandgap structure of FIG. 7 features the first stitching via 745 and the second stitching via 749 that can be formed in a single direction based on the metal plates 731, 732 and 733.

However, the electromagnetic bandgap structure of FIG. 7 can be designed to include two stitching vias having different lengths similarly to the electromagnetic bandgap structure of FIG. 6.

In FIG. 7, the first stitching via 745 can electrically connect the second metal plate 732 to the first metal plate 731 by allowing a part (refer to 743) of the first stitching via 745 to be connected through a same planar surface as the first metal layer 711, which is different from and placed more adjacently below a planar surface in which the metal plates 731, 732 and 733 are placed. The second stitching via 749 can allow a part (refer to 748) of the second stitching via 749 to be connected through a same planar surface as the second metal layer 711, which is different from and placed more distantly below the planar surface in which the metal plates 731, 732 and 733 are placed so as to electrically connect the second metal plate 732 and the third metal plate 733.

Herein, the first stitching via 745 can be formed to include a first via 741 formed to have one end part connected to the first metal plate 731 and penetrate the first dielectric layer 721, a second via 742 formed to have one end part connected to the second metal plate 732 and penetrate the first dielectric layer 721 and a connection pattern 743 formed to have one end part connected to the other end part of the first via 741 and the other end part connected to the other end part of the second via 742 and to be connected through a same planar surface as the first metal layer 711.

A first via 746 of the first stitching via 749 can be formed to have one end part connected to the second metal plate 732 and penetrate the first dielectric layer 721, the first metal layer 711 and the second dielectric layer 722. A second via 747 of the second stitching via 749 can be formed to have one end part connected to the third metal plate 733 and penetrate the first dielectric layer 721, the first metal layer 711 and the second dielectric layer 722. A connection pattern 748 of the second stitching via 749 can be formed to have one end part connected to the other end part of the first via 746 and the other end part connected to the other end part of the second via 747 and to be connected through a same planar surface as the second metal layer 712.

In FIG. 7, the second stitching via 749 can be formed between a total of three layers (i.e. the second metal layer 712, the first metal layer 711 and the metal layers 732 and 733). When 3 layers or more are connected to each other by using vias, a plated through hole (PTH) method (refer to FIG. 12A), a stack via method (refer to FIG. 12B), a staggered via method (refer to FIG. 12C) and an o-ring via (refer to FIG. 12D) can be typically used.

Figure 12A:
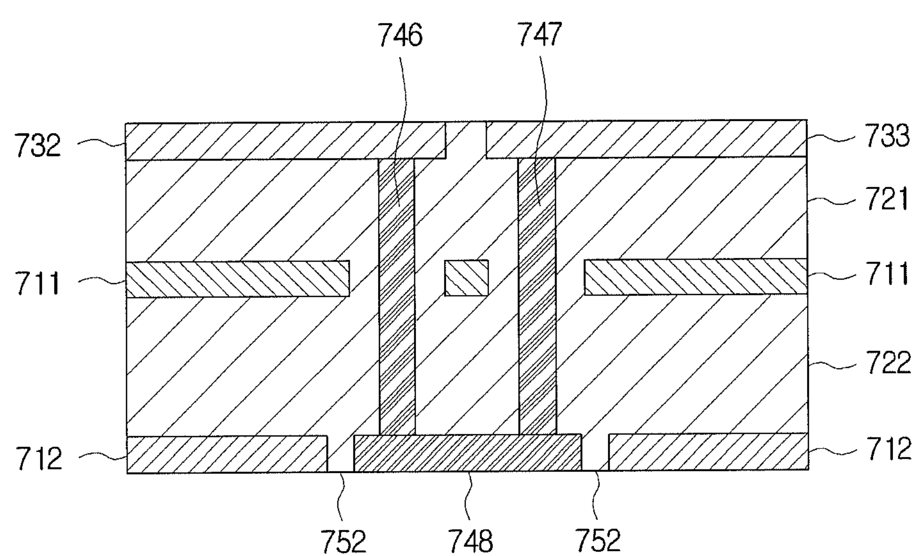
FIG. 12A through FIG. 12D show how to form a via for connecting one layer to another layer.

Although FIG. 7 shows that both the first via 746 and the second via 747 of the stitching via 749 are formed through only one process by the PTH method of FIG. 12A (the same can be applied to a stitching via of FIG. 8), the first via 746 and the second via 747 of the stitching via 749 can be formed by various other methods including the aforementioned methods.

Figure 12B:
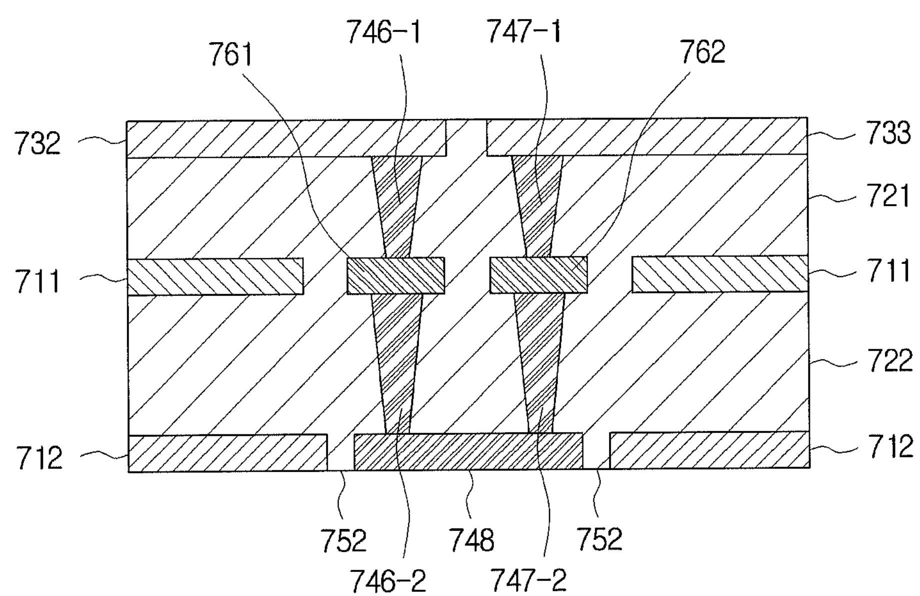
Figure 12C:
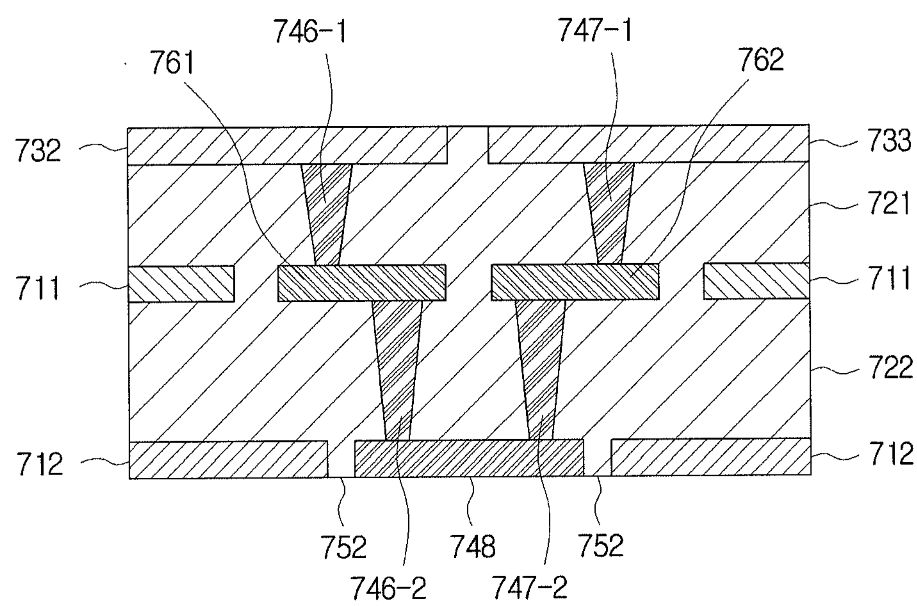
Figure 12D:
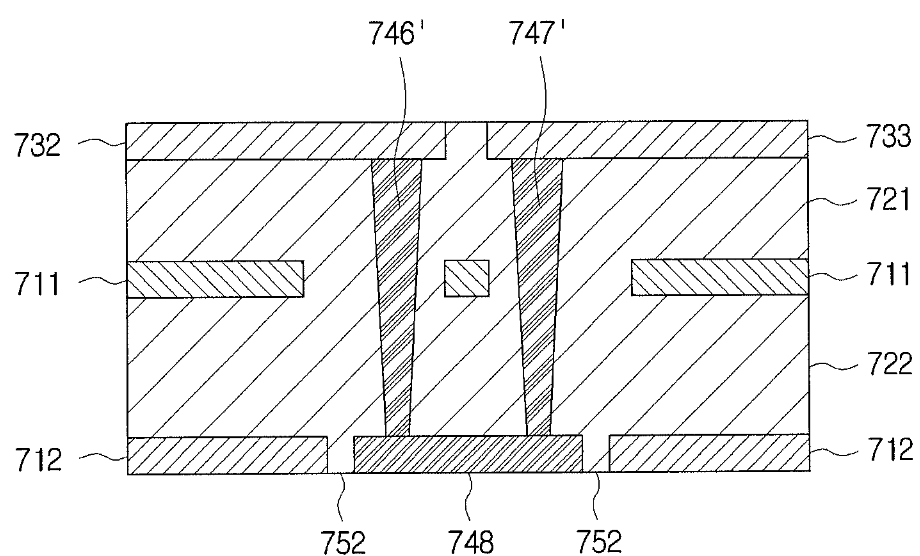

According to the stack via method of FIG. 12B or the staggered via method of FIG. 12C, a plurality of blind via holes (BVH) 746-1, 746-2, 747-1 and 747-2 (refer to FIG. 12B or FIG. 12C) can be separately formed in the stacked order by putting via lands 761 and 762 (refer to FIG. 12B or FIG. 12C), thereby perform the electrical connection.

Comparing with the stack via method of FIG. 12B, the staggered via method of FIG. 12C features a center axis of a BVH 746-1 or 747-1 that can be different from that of another BVH 746-2 or 747-2, respectively. The o-ring via method of FIG. 12D features the diameter of a via that can becomes narrower in a lower direction or an inner via hole (IVH) can be used to form a via. As a result, any method can be obviously applied to the present invention without particular restrictions.

Here, the metal layers 711 and 712 can form a layer that is different from metal plates 731, 732 and 733 in regard to electrical signals in a printed circuit board. For example, the metal layers 711 and 712 can function as a power layer, and the metal plates 731, 732 and 733 can function as a ground layer in a printed circuit board.

In this case, it may be necessary that the metal plates 731, 732 and 733 be disconnected from the first metal layer 711 and the second metal layer 712, respectively, by allowing the connection pattern 743 of the first stitching via 745 and the connection pattern 748 of the second stitching via 749 to be accommodated in a clearance hole 751 formed on the first metal layer 711 and a clearance hole 752 formed on the second metal layer 712, respectively, as shown in FIG. 7.

In FIG. 7, the first via 746 and the second via of the second stitching via 749, which penetrate the first metal layer 711 may be required to be accommodated in a clearance hole 753 and a clearance hole 754, respectively, which are additionally formed on the first metal layer 711.

As such, the electromagnetic bandgap structure in accordance with the third embodiment of the present invention features two metal layer 711 and 712 that can be placed on different planar surfaces in a single direction based on the metal plates 731, 732 and 733. In this case, the stitching via (i.e. the second stitching via 712) to be connected through the metal layer (i.e. the second metal layer 712 in FIG. 7) that is relatively distant from the metal plates among the two stitching vias may be required to penetrate the metal layer (i.e. the first metal layer 711 in FIG. 7) that is relatively close to the metal plate.

Accordingly, it may be necessary that additional clearance holes (refer to 753 and 754 of FIG. 7) be formed on the metal layer that is relatively close to the metal plate to correspond to the position which the stitching via to be connected through the relatively distant metal plate will penetrate.

In accordance with the third embodiment of the present invention, each of the first stitching via 745 and the second stitching via 749, which extends from the metal plates 731, 732 and 733 in a same direction and different lengths, can also function as each of the inductance components having different values in proportion to the lengths. The metal plates 731, 732 and 733, the first metal layer 711 and the first dielectric layer 721 placed therebetween can function as a capacitance component. Similarly, the first metal 711, the second metal layer 712 and the second dielectric layer 722 placed therebetween can function as a capacitance component.

Accordingly, if the structure of FIG. 7 is repeatedly arranged on a whole part (refer to FIG. 4A through FIG. 4D) or a part (refer to FIG. 4E) of an inner surface of the printed circuit board as a noise transferable path, it is possible to function as the electromagnetic bandgap structure that can prevent a signal of a certain frequency band from being transferred.

Similarly to the electromagnetic bandgap structure of FIG. 6, the first stitching via 745 and the second stitching via 749 are also designed to have different lengths according to the electromagnetic bandgap structure of FIG. 7, thereby acquiring two bandgap frequencies having different bands.

FIG. 8 is a plan view showing a multi-layered electromagnetic bandgap structure having a stitching via and a printed circuit board having the same in accordance with a fourth embodiment of the present invention.

The electromagnetic bandgap structure in accordance with a fourth embodiment of the present invention can include a plurality of metal plates 831, 832 and 833 placed on any one planar surface of a printed circuit board, a metal layer 812 paced on a planar surface that is different from a planar surface on which the metal plates 831, 832 and 833 are placed, at least another metal layer (i.e. a metal layer 811 in FIG. 8) placed between the metal plates 831, 832 and 833 and the metal 812, a first stitching via 845 electrically connecting any one 832 of the metal plates 831, 832 and 833 to another metal plate 831 and a second stitching via 849 electrically connecting any one metal plate 832 to yet another metal plate 833.

A dielectric layer 821 and a dielectric layer 822 can be interposed between the metal plates 831, 832 and 833 and any one metal plate 811 and between the two metal layers 811 and 812.

For the convenience of describing the drawings and comparison with the structure of the electromagnetic bandgap of FIG. 3A, FIG. 3B, FIG. 5, and FIG. 6 and FIG. 7, the metal layer represented by the reference numeral 811, the metal layer represented by the reference numeral 812, the metal plate represented by the reference numeral 831, the metal plate represented by the reference numeral 832, the metal plate represented by the reference numeral 833, the dielectric layer represented by the reference numeral 821 and the dielectric layer represented by the reference numeral 822 can be re-named as a first metal layer 811, a second metal layer 812, a first metal plate 831, a second metal plate 832, a third metal layer 833, a first dielectric layer 821 and a second dielectric layer 822.

Here, the electromagnetic bandgap structure of FIG. 8 can have a three-layered structure including the second metal layer 812 as a first layer, the first metal layer 811 as a second layer and the metal plates 831, 832 and 833 as a third layer, and the stitching vias can extend from the metal plates 831, 832 and 833 in a direction only, identically to the electromagnetic bandgap structure of FIG. 7.

However, comparing with the electromagnetic bandgap structure of FIG. 7, the electromagnetic bandgap structure of FIG. 8 features all of the stitching vias 845 and 849 that are designed not to be connected through the metal layer (i.e. the first metal layer 811 in FIG. 8) that is most adjacent to the metal plates 831, 832 and 833.

In particular, the first stitching via 845 and the second stitching via 849 can electrically connect the first metal plate 831 to the second metal plate 832 and the second metal plate 832 to the metal plate 833, respectively, by allowing a part (refer to 843) of the first stitching via 845 and a part (refer to 848) of the second stitching via 849 to be connected through a position and another position, respectively, on a same planar surface as the metal layer (i.e. the second metal layer 812) that is not most adjacent to the metal plates 831, 832 and 833.

Herein, the first via 841 of the first stitching via 845 can be formed to have one end part connected to the first metal plate 831 and penetrate the dielectric metal layer 821, the first metal layer 811 and the second dielectric layer 822. The first via 842 of the first stitching via 845 can be formed to have one end part connected to the second metal plate 832 and penetrate the dielectric metal layer 821, the first metal layer 811 and the second dielectric layer 822. A connection pattern 843 of the first stitching via 845 can be formed to have one end part connected to the other end part of the first via 841 and the other end part connected to the other end part of the second via 842 and to be connected through a same planar surface as the second metal layer 812.

Similarly, the first via 846 of the first stitching via 849 can be formed to have one end part connected to the second metal plate 832 and penetrate the dielectric metal layer 821, the first metal layer 811 and the second dielectric layer 822. The first via 847 of the first stitching via 849 can be formed to have one end part connected to the third metal plate 833 and penetrate the dielectric metal layer 821, the first metal layer 811 and the second dielectric layer 822. A connection pattern 848 of the first stitching via 849 can be formed to have one end part connected to the other end part of the first via 846 and the other end part connected to the other end part of the second via 848 and to be connected through a same planar surface as the second metal layer 812.

At this time, the metal layers 811 and 812 can form a layer that is different from metal plates 831, 832 and 833 in regard to electrical signals in a printed circuit board. In this case, it may be necessary that the metal plates 831, 832 and 833 be disconnected from the second metal layer 712 by allowing the connection pattern 843 of the first stitching via 845 and the connection pattern 848 of the second stitching via 849 to be accommodated in a clearance hole 851 and another clearance hole 852, respectively, on different positions of the second metal layer 812, as shown in FIG. 8.

Moreover, since the vias 841 and 842 of the first stitching via 845 and the vias 846 and 847 of the second stitching via 849 may be required to penetrate the first metal layer 811, it may be necessary that clearance holes 853, 854, 855 and 856 be formed on positions which the vias 841, 842, 846 and 847, respectively, will penetrate.

In accordance with the fourth embodiment of the present invention, each of the first stitching via 845 and the second stitching via 849, which extends from the metal plates 831, 832 and 833 in a same direction, can also function as each inductance component. The metal plates 831, 832 and 833, the first metal layer 811 and the first dielectric layer 821 placed therebetween can function as a capacitance component. Similarly, the first metal 811, the second metal layer 812 and the second dielectric layer 822 placed therebetween can function as a capacitance component.

Accordingly, if the structure of FIG. 8 is repeatedly arranged on a whole part (refer to FIG. 4A through FIG. 4D) or a part (refer to FIG. 4E) of an inner surface of the printed circuit board as a noise transferable path, it is possible to function as the electromagnetic bandgap structure that can prevent a signal of a certain frequency band from being transferred.

By the electromagnetic bandgap structure described above in detail with reference to FIG. 5 through FIG. 8, it is possible to realize various bandgap frequency bands, and thus the electromagnetic bandgap structure can be universally applied more variable application apparatuses and electronically apparatuses. This is because the electromagnetic bandgap structure has the following properties in accordance with each embodiment of the present invention.

Firstly, the electromagnetic bandgap structure of the present invention can acquire a longer length of a stitching via connecting a metal plate to another metal plate. It is because since each stitching via of the electromagnetic bandgap structure of the present invention can to be connected through not only an adjacent metal layer but also other metal layers to electrically connect any two metal plates, it is possible to acquire an inductance value that is increased due to the extended length of the stitching via. Of cause, it shall be obvious that the electromagnetic bandgap structure of the present invention can allow other electrical components (e.g. a capacitance component caused between the layers and a metal plate and a metal layer) to be increased by being formed to include not only an adjacent metal layer but also other metal layers.

As a result, the electromagnetic bandgap structure of the present invention can acquire more various adjustable factors (e.g. various types of inductance and capacitance components) as compared with the conventional electromagnetic bandgap structure (e.g. the mushroom type electromagnetic bandgap structure of FIG. 2A and FIG. 2B). This shows that it is possible to freely adjust a bandgap frequency band, which is an object frequency required to be blocked, and its noise level.

Secondly, the electromagnetic bandgap structure of the present invention can have a structure that is more adequate for a multilayered printed circuit board. A two-layered structure such as the mushroom type electromagnetic structure of FIG. 2A and FIG. 2B and the two-layered electromagnetic bandgap structure having a stitching via of FIG. 3*a* and FIG. 3B must acquire the capacitance component and the inductance component in the two layers only. This causes a problem of forming a structure in the two layers that is more complex and dense. Moreover, this is not adequate when several active devices and passive devices need to be implemented in a complex wiring board having various types of electronic circuits formed on the same board or in a narrow area such as a system in package (SiP).

The electromagnetic bandgap structure of the present invention, however, can form a via or a connection pattern in a plurality of layers of a multi-layered printed circuit board, thereby increasing a design freedom or flexibility.

Finally, the electromagnetic bandgap board of the present invention can form stitching vias having different lengths, to thereby expand a bandgap frequency band and acquire two or more bandgap frequencies through one electromagnetic bandgap structure. This can be understood through a frequency property comparison graph of FIG. 9, described below.

Figure 9:
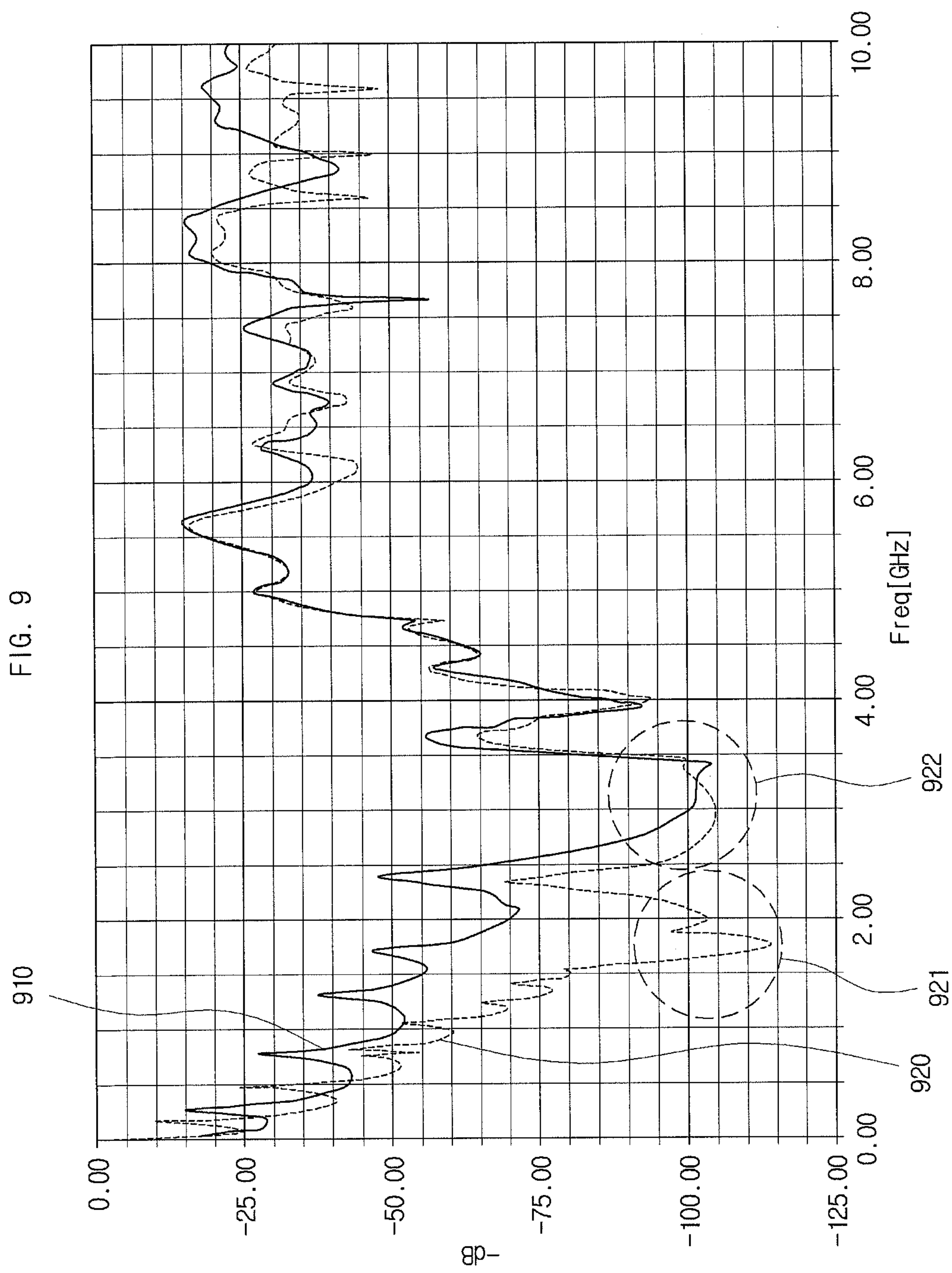
FIG. 9 is a graph showing frequency properties of the electromagnetic bandgap structures of FIG. 3B and FIG. 6 for comparison.

FIG. 9 is graphs showing frequency properties of the electromagnetic bandgap structures of FIG. 3B and FIG. 6 for comparison.

In particular, FIG. 9 shows the frequency properties analyzed by using a scattering parameter to check whether the electromagnetic bandgap structure suggested by the present invention has a stop band property of a certain frequency band. Here, a reference numeral 910 indicates a frequency property of the two-layered electromagnetic bandgap structure having a stitching via of FIG. 3B, and a reference numeral 920 indicates a frequency property of a multi-layered electromagnetic bandgap structure having a stitching via of FIG. 6.

Referring to FIG. 9, it can be recognized that the electromagnetic bandgap frequency of FIG. 3B has the bandgap frequency band of between about 1.5 and 4.7 GHz, on a blocking rate −50 dB basis, but the electromagnetic bandgap structure of FIG. 6B has the bandgap frequency band of between about 0.75 and 4.7 GHz on the same blocking rate (i.e. −50 dB) basis. In other words, the electromagnetic bandgap structure of FIG. 6 in accordance with the present invention can have a wider noise blocking range than the electromagnetic bandgap structure of FIG. 3B. Of course, it can be recognized that the electromagnetic bandgap structure of FIG. 6 can have a lower noise level (i.e. a blocking rate) than the electromagnetic bandgap structure of FIG. 3B on the same blocking frequency band basis.

It can be also recognized that the electromagnetic bandgap structure of FIG. 6 has two bandgap frequency bands on a blocking rate −75 dB basis (refer to reference numerals 921 and 922 of FIG. 1). This is because the electromagnetic bandgap structure of FIG. 6 has two stitching vias having different lengths.

Here, the frequency property graph of FIG. 9 is merely an example showing how different the frequency properties of the electromagnetic bandgap structures of FIG. 3B and FIG. 6 are. Accordingly, it shall be obvious that the bandgap frequency and its blocking rate, shown by the simulation result of FIG. 9, can be varied according to the change of a capacitance value caused by the factors such as a spaced distance between the metal plates or the metal layers, a dielectric constant of a dielectric material forming each dielectric layer, the thickness of each dielectric layer and the size, shape and area of the metal plate and the change of an inductance value caused by the factors such as the shape, length, thickness, width and area of the stitching via.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure comprising: at least three conductive plates placed on a same planar surface; a first stitching via, configured to electrically connect any one of the conductive plates to another conductive plate; and a second stitching via, configured to electrically connect the one conductive plate to yet another conductive plate, wherein the first stitching via electrically connects the one conductive plate to another conductive plate by allowing a part of the first stitching via to be connected through a planar surface above or below the one conductive plate, and the second stitching via electrically connects the one conductive plate to yet another conductive plate by allowing a part of the second stitching via to be connected through a planar surface that is different from the planar surface through which the part of the first stitching via is connected, the two planar surfaces being placed in a same direction based on the three or more conductive plates.

2. The electromagnetic bandgap structure of claim 1, wherein the first stitching via comprises:

- a first via, one end part of the first via configured to be connected to the one conductive plate;
- a second via, one end part of the second via configured to be connected to another conductive layer; and
- a connection pattern, configured to be placed on a planar surface above or below the one conductive plate and to have one end part connected to the other end part of the first via and the other end part connected to the other end part of the second via.

3. The electromagnetic bandgap structure of claim 2, wherein the connection pattern is accommodated in a clearance hole formed on the conductive layer.

4. The electromagnetic bandgap structure of claim 1, wherein the second stitching via comprises:

- a first via, one end part of the first via configured to be connected to the one conductive plate;
- a second via, one end part of the second via configured to be connected to yet another conductive layer; and
- a connection pattern, configured to be placed on a planar surface that is different from the planar surface through which the part of the first stitching via is connected, the two planar surfaces being placed in a same direction based on the three or more conductive plates, and to have one end part connected to the other end part of the first via and the other end part connected to the other end part of the second via.

5. The electromagnetic bandgap structure of claim 4, wherein the connection pattern is accommodated in a clearance hole formed on the conductive layer.

6. The electromagnetic bandgap structure of claim 1, wherein the conductive layer has a polygonal, circular or elliptical shape.

7. The electromagnetic bandgap structure of claim 1, wherein the conductive plates have a same size.

8. The electromagnetic bandgap structure of claim 1, wherein the conductive plates are distinguished into a plurality of groups having different sizes.

9. An electromagnetic bandgap structure comprising: at least three conductive plates placed on a same planar surface; a first stitching via, configured to electrically connect any one of the conductive plates to another conductive plate; and a second stitching via, configured to electrically connect the one conductive plate to yet another conductive plate, wherein the first stitching via and the second stitching via electrically connect the one conductive plate to another conductive plate and yet another conductive plate, respectively, by allowing a part of the first stitching via and a part of the second stitching via to be connected through a location and another location, respectively, on a same planar surface, and at least one conductive layer is placed between at least one of the part of the first stitching via and the part of the second stitching via and the conductive layers.

10. The electromagnetic bandgap structure of claim 9, wherein the first stitching via comprises:

a first via, one end part of the first via configured to be connected to the one conductive plate;

a second via, one end part of the second via configured to be connected to another conductive layer; and a connection pattern, configured to be placed on the same planar surface and to have one end part connected to the other end part of the first via and the other end part connected to the other end part of the second via.

11. The electromagnetic bandgap structure of claim 10, wherein the connection pattern is accommodated in a clearance hole formed on the conductive layer.

12. The electromagnetic bandgap structure of claim 9, wherein the second stitching via comprises:

a first via, one end part of the first via configured to be connected to the one conductive plate;

a second via, one end part of the second via configured to be connected to yet another conductive layer; and a connection pattern, configured to be placed on the same planar surface and to have one end part connected to the other end part of the first via and the other end part connected to the other end part of the second via.

13. The electromagnetic bandgap structure of claim 12, wherein the connection pattern is accommodated in a clearance hole formed on the conductive layer.

14. The electromagnetic bandgap structure of claim 9, wherein a clearance hole is formed each on the conductive layer through which the first stitching via and the second stitching via, respectively, are to pass.

15. The electromagnetic bandgap structure of claim 9, wherein the conductive layer has a polygonal, circular or elliptical shape.

16. The electromagnetic bandgap structure of claim 9, wherein the conductive plates have a same size.

17. The electromagnetic bandgap structure of claim 9, wherein the conductive plates are distinguished into a plurality of groups having different sizes.

18. A printed circuit board, comprising an electromagnetic bandgap structure, arranged in an area of a noise transferable path between a noise source point and a noise blocking destination point of the printed circuit board, wherein the electromagnetic bandgap structure comprises: at least three conductive plates placed on a same planar surface; a first stitching via, configured to electrically connect any one of the conductive plates to another conductive plate; and a second stitching via, configured to electrically connect the one conductive plate to yet another conductive plate, wherein: the first stitching via electrically connects the one conductive plate to another conductive plate by allowing a part of the first stitching via to be connected through a planar surface above or below the one conductive plate, and the second stitching via electrically connects the one conductive plate to yet another conductive plate by allowing a part of the second stitching via to be connected through a planar surface that is different from the planar surface through which the part of the first stitching via is connected, the two planar surfaces being placed in a same direction based on the three or more conductive plates.

19. A printed circuit board, comprising an electromagnetic bandgap structure, arranged in an area of a noise transferable path between a noise source point and a noise blocking destination point of the printed circuit board, wherein the electromagnetic bandgap structure comprises: at least three conductive plates placed on a same planar surface; a first stitching via, configured to electrically connect any one of the conductive plates to another conductive plate; and a second stitching via, configured to electrically connect the one conductive plate to yet another conductive plate, wherein: the first stitching via and the second stitching via electrically connect the one conductive plate to another conductive plate and yet another conductive plate, respectively, by allowing a part of the first stitching via and a part of the second stitching via to be connected through a location and another location, respectively, on a same planar surface, and at least one conductive layer is placed between at least one of the part of the first stitching via and the part of the second stitching via and the conductive layers.

* * * * *